(12) United States Patent
Brewer et al.

(10) Patent No.: US 11,094,699 B1
(45) Date of Patent: Aug. 17, 2021

(54) APPARATUSES INCLUDING STACKED HORIZONTAL CAPACITOR STRUCTURES AND RELATED METHODS, MEMORY DEVICES, AND ELECTRONIC SYSTEMS

(71) Applicant: Micron Technology, Inc., Boise, ID (US)

(72) Inventors: William M. Brewer, Boise, ID (US); Christopher Locke, Boise, ID (US); Kyle B. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/886,497

(22) Filed: May 28, 2020

(51) Int. Cl.
*H01L 27/108* (2006.01)
*H01L 29/786* (2006.01)
*H01L 29/06* (2006.01)
*H01L 29/423* (2006.01)

(52) U.S. Cl.
CPC .... *H01L 27/10805* (2013.01); *H01L 27/1085* (2013.01); *H01L 27/10873* (2013.01); *H01L 27/10897* (2013.01); *H01L 29/0673* (2013.01); *H01L 29/42392* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 5,061,650 A | 10/1991 | Dennison et al. | |
| 5,168,073 A | 12/1992 | Gonzalez et al. | |
| 5,270,241 A | 12/1993 | Dennison et al. | |
| 6,160,285 A | 12/2000 | Schugraf et al. | |
| 7,518,182 B2 | 4/2009 | Abbott et al. | |
| 7,936,000 B2 | 5/2011 | Tang et al. | |
| 8,486,791 B2 | 7/2013 | Lue | |
| 8,599,616 B2 | 12/2013 | Roizin et al. | |
| 9,224,810 B2* | 12/2015 | Kim | H01L 21/823828 |

(Continued)

OTHER PUBLICATIONS

Guo et al, Electrostatics of Nanowire Transistors, Other Nanotechnology Publications. Paper 14, http://docs.lib.purdue.edu/nanodocs/14, (Dec. 1, 2003), pp. 329-334.

(Continued)

*Primary Examiner* — Anthony Ho
*Assistant Examiner* — Kevin Quinto
(74) *Attorney, Agent, or Firm* — TraskBritt

(57) ABSTRACT

An apparatus includes fin structures comprising individual levels of a conductive material having elongated portions extending in a first horizontal direction, first conductive lines extending in a second horizontal direction transverse to the first horizontal direction, and second conductive lines extending in a vertical direction transverse to each of the first horizontal direction and the second horizontal direction. At least portions of the first conductive lines are aligned vertically. The apparatus also includes horizontal capacitor structures comprising the conductive material of the fin structures and access devices proximate intersections of the first conductive lines and the second conductive lines. The access devices comprise the conductive material of the fin structures. Memory devices, electronic systems, and methods of forming the apparatus are also disclosed.

21 Claims, 19 Drawing Sheets

(56) References Cited

U.S. PATENT DOCUMENTS

| | | |
|---|---|---|
| 9,449,978 B2 | 9/2016 | Karda et al. |
| 9,947,687 B2 | 4/2018 | Bedeschi |
| 9,985,101 B2 | 5/2018 | Hatem et al. |
| 10,347,637 B2 | 7/2019 | Sandhu |
| 2007/0126044 A1* | 6/2007 | Shioya ............... H01L 29/0665 |
| | | 257/306 |
| 2018/0061835 A1 | 3/2018 | Yang et al. |

OTHER PUBLICATIONS

Lee et al., Nanowire Zero-Capacitor DRAM Transistors with and without Junctions, Proceedings of 10th IEEE International Conference on Nanotechnology Joint Symposium with Nano Korea (Aug. 17-20, 2010), pp. 242-245.

Monolithic 3D, Introducing our Monolithic 3D DRAM Technology, http://www.monolithic3d.com/blog/introducing-our-monolithic-3d-dram-technology, (Mar. 13, 2020), 7 pages.

* cited by examiner

APPARATUSES INCLUDING STACKED HORIZONTAL CAPACITOR STRUCTURES AND RELATED METHODS, MEMORY DEVICES, AND ELECTRONIC SYSTEMS

TECHNICAL FIELD

Embodiments disclosed herein relate to the field of microelectronic device design and fabrication. More particularly, embodiments of the disclosure relate to apparatuses including stacked horizontal capacitor structures, and to related memory devices and electronic systems, and to methods of forming the apparatus.

BACKGROUND

A continuing goal of integrated circuit fabrication is to increase integration density. Dynamic random-access memory (DRAM) utilizes DRAM capacitors to store an amount of electrical charge that represents the logical value of a stored bit. Some DRAM capacitors include container-shaped capacitors having one electrode shaped as a container, with a cell dielectric material and another electrode on the inside of the container only (e.g., a single-sided hole capacitor), or on the outside of the container only (e.g., a single-sided pillar capacitor), or on both the inside and outside of the container (e.g., a double-sided container). To increase integration density, the lateral footprint of the DRAM capacitors has been reduced by increasing the aspect ratio (i.e., ratio of height to width or diameter) and decreasing the proximity of adjacent DRAM capacitors to one another. The high aspect ratio and smaller dimensions have led to structurally weak containers that are prone to toppling or breaking. The container-shaped capacitors may be vertically oriented with a hollow, cylindrical shape anchored at the top and bottom but are capable of lateral movement, which causes deformation of (e.g., damage to) the DRAM capacitor. Therefore, the structural stability and mechanical strength of the container is significant to the operability of the DRAM capacitor in the DRAM device. Retaining structures (e.g., lattice structures) have been used to strengthen the vertically oriented container by supporting exterior sidewalls of the containers defined by electrodes. However, using the retaining structures increases the complexity of the DRAM capacitor fabrication process.

Further, conventional DRAM device structures include tiers of conductive structures (e.g., access lines, data lines, etc.) separated by dielectric material. Some conventional DRAM device structures include positioning capacitor pillars vertically above the access lines and corresponding access devices (e.g., transistors). However, forming the capacitor pillars vertically above the access lines and access devices in such device structures requires additional real estate within the DRAM device.

With the decreasing size of the DRAM capacitors, the cross-sectional area of the container may be decreased, resulting in reduced container capacitance. The decreased size of individual DRAM capacitors and decreased proximity of adjacent capacitors increases the susceptibility of bridging (e.g., electrical connection) between two or more adjacent capacitors during fabrication, as well as leakage during operation of the DRAM devices. Accordingly, conventional DRAM capacitors may not be adequate to reduce leakage as a result of coupling capacitance between horizontally neighboring capacitors as DRAM devices are scaled down in size to increase the integration density.

DETAILED DESCRIPTION

Figure 1A:
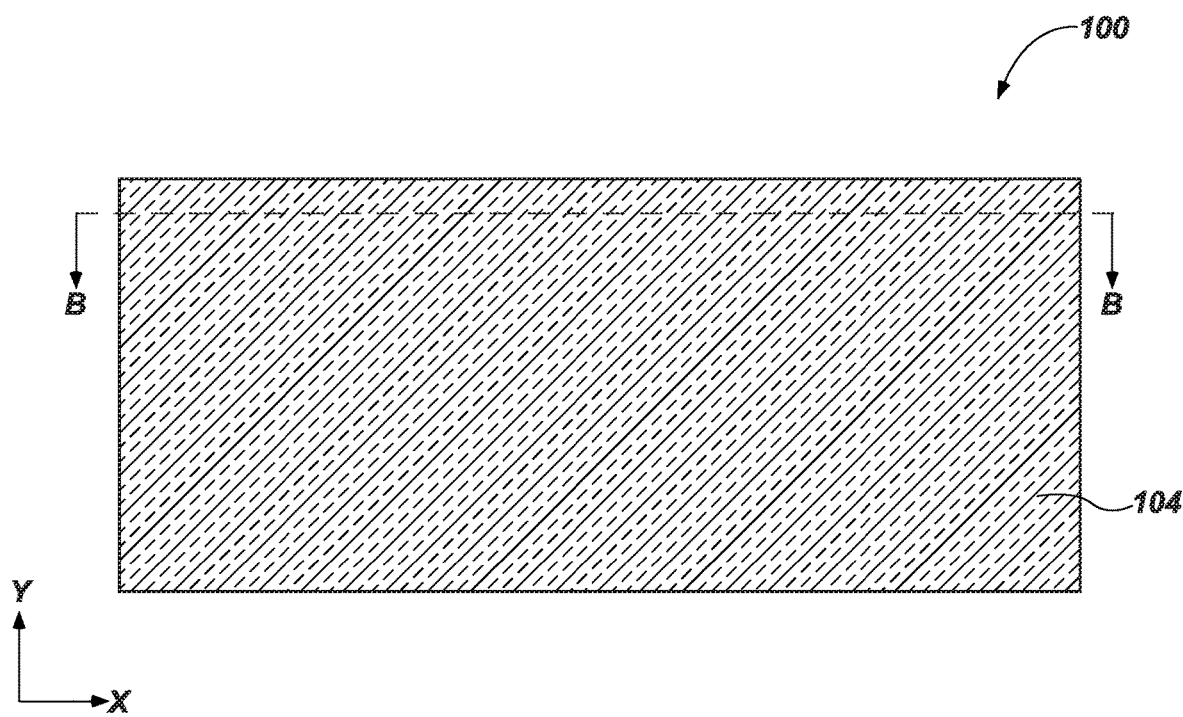
FIGS. 1A through 7B are simplified partial top-down (FIGS. 1A, 2A, 3A, 4A, 5A, 6A, and 7A) and simplified partial cross-sectional (FIGS. 1B, 2B, 3B, 4B, 5B, 6B, and 7B) views illustrating a method of forming an apparatus including a device structure, in accordance with embodiments of the disclosure, where the cross-sectional views of FIGS. 1B, 2B, 3B, 4B, 5B, 6B, and 7B are taken along line B-B in FIGS. 1A, 2A, 3A, 4A, 5A, 6A, and 7A.

An apparatus (e.g., a microelectronic device, a semiconductor device, a memory device) is disclosed that includes fin structures comprising individual levels of a conductive material having elongated portions extending in a first horizontal direction. The apparatus includes first conductive lines (e.g., data lines) extending in a second horizontal direction transverse to the first horizontal direction and second conductive lines (e.g., access lines) extending in a vertical direction transverse to each of the first horizontal direction and the second horizontal direction. At least portions of the first conductive lines are aligned vertically. Portions of the fin structures are present in access devices of the apparatus and other portions of the fin structures are present in capacitor structures of the apparatus. The capacitor structures include horizontal capacitor structures comprising the conductive material of the fin structures. Each of the horizontal capacitor structures comprises an individual level of the conductive material of the fin structures extending in the first horizontal direction and connected by a contact region extending in the second horizontal direction. Accordingly, the horizontal capacitor structures are aligned horizontally in the first horizontal direction and are stacked vertically in the vertical direction. As used herein, the term "aligned horizontally" with reference to the horizontal capacitor structures means and includes an orientation of the capacitor structures such that elongated portions of electrodes of the individual capacitor structures extend in a horizontal direction. In other words, a major plane of each of the horizontal capacitor structures is substantially parallel with a major plane of an underlying base material (e.g., a substrate). Multiple horizontal capacitor structures may be stacked vertically such that the individual capacitor structures (e.g., individual capacitor containers) are in direct vertical alignment with one another with outer perimeters thereof being vertically aligned.

The access devices are proximate intersections of the first conductive lines and the second conductive lines. The access devices comprise the conductive material of the fin structures. Individual access devices include gate structures at least partially surrounded by a gate dielectric material. The gate structures substantially surround the conductive material of the fin structures. In some embodiments, individual horizontal capacitor structures and respective access devices share a common gate structure, the horizontal capacitor structures on each individual level of the conductive material of the fin structures share a common data line, and the horizontal capacitor structures aligned in a single vertical column share a common access line. By providing the capacitor structures that are aligned horizontally and stacked vertically within the apparatus, such configurations may allow for improved density as memory devices are scaled down in size to increase the density of memory cells, which improved density may result in reduced power consumption during use and operation. Such a configuration may result in reduced occurrences of bridging (e.g., electrical connection) between two or more adjacent capacitor structures, as well as reduced leakage during use and operation of the apparatus.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a microelectronic device or a complete process flow for manufacturing the microelectronic device and the structures described below do not form a complete microelectronic device. Only those process acts and structures necessary to understand the embodiments described herein are described in detail below. Additional acts to form a complete microelectronic device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "configured" refers to a size, shape, material composition, and arrangement of one or more of at least one structure and at least one apparatus facilitating operation of one or more of the structure and the apparatus in a pre-determined way.

As used herein, the term "pitch" refers to a distance between identical points in two adjacent (i.e., neighboring) features.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the phrase "coupled to" refers to structures operatively connected with each other, such as electrically connected through a direct ohmic connection or through an indirect connection (e.g., via another structure).

As used herein, the term "selectively etchable" means and includes a material that exhibits a greater etch rate responsive to exposure to a given etch chemistry relative to another material exposed to the same etch chemistry. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "junctionless nanowire" means and includes a structure comprising one or more conductive materials that are doped with dopants of the same polarity such that there are no implants having differing polarities conventionally used to form PN junctions (e.g., p-n-p junctions, n-p-n junctions).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIGS. 1A through 7B illustrate a method of forming an apparatus including a device structure (e.g., a microelectronic device structure) including stacked horizontal capacitor structures (e.g., DRAM capacitor structures), at various stages of the method, according to an embodiment of this disclosure. For simplicity, the formation of a single device structure is illustrated, but it will be understood by one of ordinary skill in the art that the method may include simultaneously forming multiple (e.g., more than one, an array of) device structures. For convenience in describing FIGS. 1A through 7B, a first direction may be defined as a direction, shown in FIGS. 1A through 7B, as the X-direction. A second direction, which is transverse (e.g., perpendicular) to the first direction, is shown in FIGS. 1A, 2A, 3A, 4A, 5A, 6A, and 7A, as the Y-direction. A third direction, which is transverse (e.g., perpendicular) to each of the first direction and the second direction, may be defined as a direction (e.g., vertical direction), shown in FIGS. 1B, 2B, 3B, 4B, 5B, 6B, and 7B, as the Z-direction. Similar directions are defined, as shown in FIGS. 8 through 17, as discussed in greater detail below.

Figure 1B:
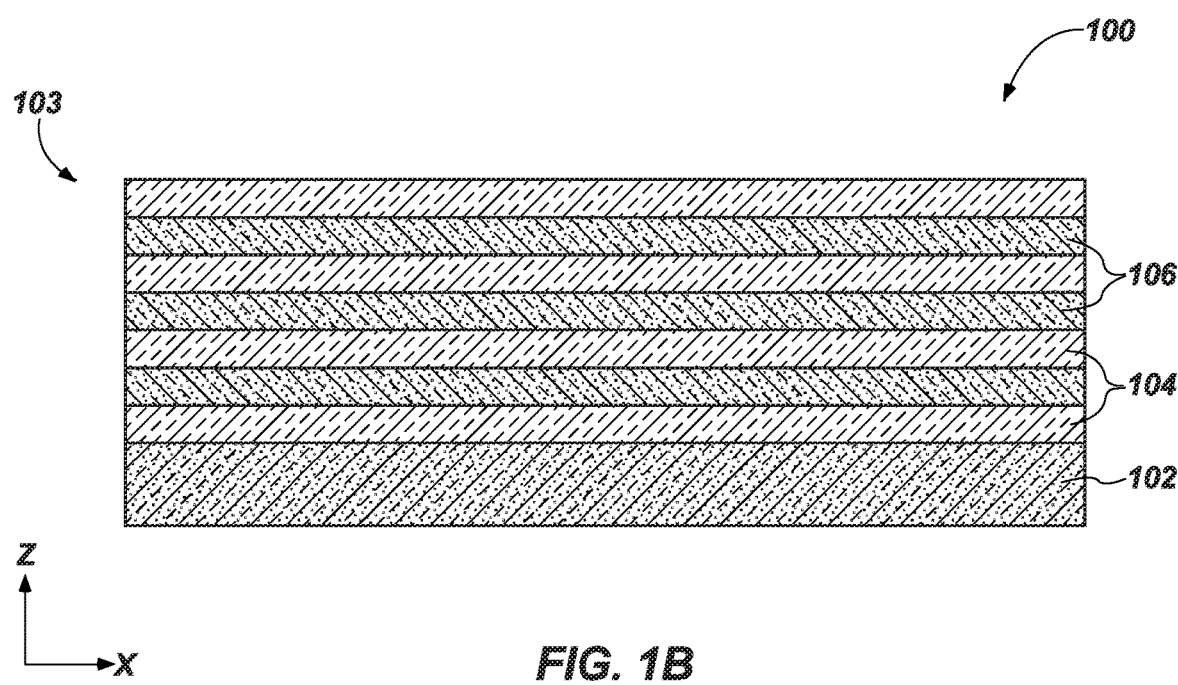

A device structure 100 including a stack 103 of alternating conductive materials and electrically insulative materials is shown in FIGS. 1A and 1B. FIG. 1A is a simplified partial top-down view of the device structure 100 and FIG. 1B shows a cross-sectional view of the device structure 100 through section line B-B of FIG. 1A. Similar views are shown in FIGS. 2A through 7B, respectively, as discussed in greater detail below. The device structure 100 includes the stack 103 of alternating tiers of electrically insulative material 104 and conductive material 106 formed adjacent (e.g., on or over) a base material 102 (e.g., a substrate). As discussed below, portions of the conductive material 106 may be configured as a junctionless nanowire transistor of the apparatus and other portions of the conductive material 106 may be configured as a capacitor structure of the apparatus. By way of example only, the base material 102 may be a semiconductor substrate, a base semiconductor layer on a supporting structure, or a metal electrode or a semiconductor substrate having one or more layers, structures or regions formed thereon.

The electrically insulative material 104 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric oxycarbide material (e.g., $SiO_xC_z$), at least one dielectric carboxynitride material (e.g., $SiO_xC_zN_y$), and amorphous carbon. In some embodiments, the electrically insulative material 104 comprises a silicon dioxide material.

The conductive material 106 may include a metal, such as tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrOx), ruthenium oxide (RuOx), alloys thereof, a conductively-doped semiconductor material (e.g., conductively-doped silicon, conductively-doped germanium, conductively-doped silicon germanium, etc.), polycrystalline silicon (also known as "polysilicon"), other materials exhibiting electrical conductivity, or combinations thereof. The conductive material 106 may be, in whole or in part, crystalline (e.g., monocrystalline, polycrystalline) or amorphous. The conductive material 106 may be undoped, or may include one or more (e.g., a single) dopant, such as a p-type dopant or an n-type dopant, as discussed in greater detail with reference to FIG. 8. In some embodiments, the dopant may include a p-type dopant comprising phosphorous (P) or arsenic (As), for example, without comprising aluminum (Al) and silicon (Si). In other embodiments, the dopant may be an n-type dopant, such as aluminum (Al) and silicon (Si) without comprising phosphorous (P) or arsenic (As). In some embodiments, the conductive material 106 is polysilicon. In some embodiments, the conductive material 106 may be a homogeneous material and include a uniform concentration of the dopant. In other embodiments, the conductive material 106 may be a heterogeneous material and include a gradient of the at least one dopant, with a higher dopant concentration and a lesser dopant concentration along a vertical portion (e.g., the Z-direction) and/or at least one horizontal portion (e.g., the X-direction, the Y-direction) thereof. An interface between a region of the higher dopant concentration and another region of the lesser dopant concentration may not necessarily be along a straight line.

The alternating electrically insulative material 104 and the conductive material 106 may each individually be formed using conventional material processes, which are not described in detail herein. As a non-limiting example, the electrically insulative material 104 and the conductive material 106 may each individually be formed through one or more conventional deposition processes (e.g., a PVD process, a CVD process, ALD process, a spin-coating process).

Figure 2A:
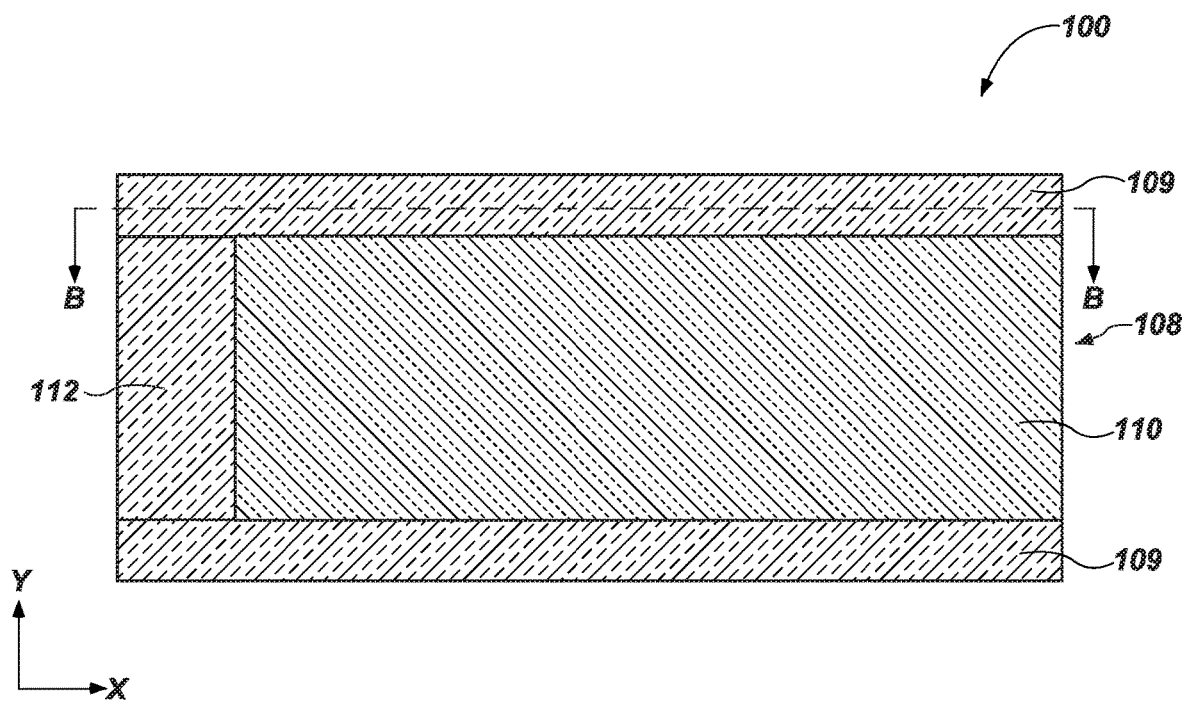
Figure 2B:
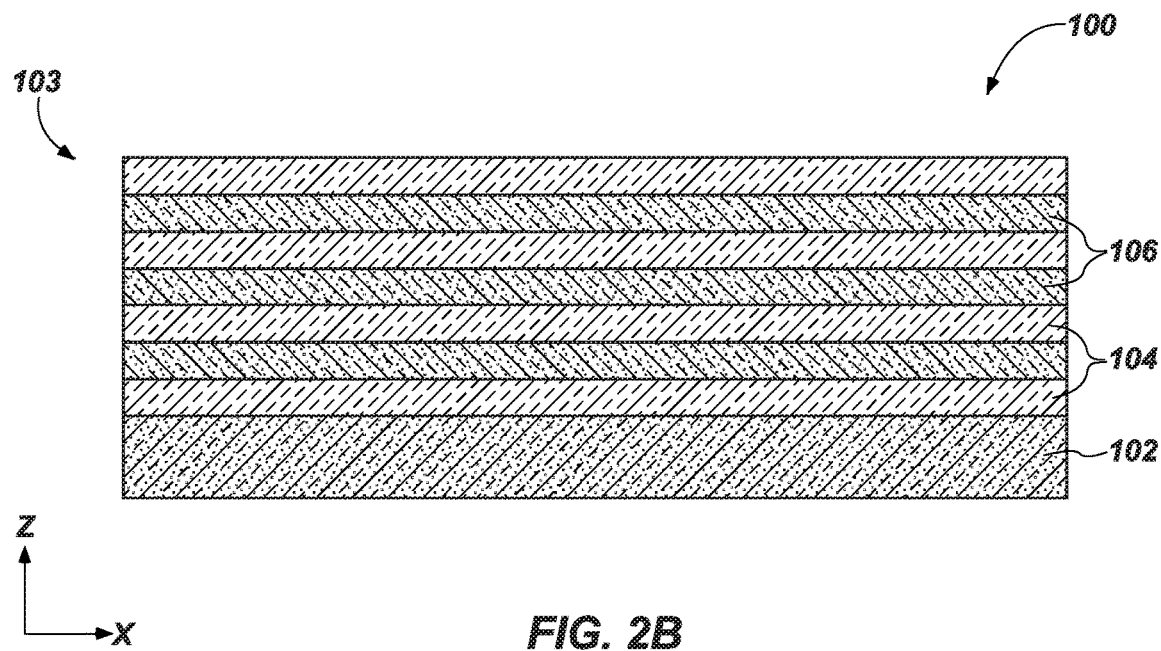

With reference to FIGS. 2A and 2B, a central opening 108 may be formed in the tiers of the alternating electrically insulative material 104 and the conductive material 106. As shown in FIG. 2A, the central opening 108 may extend vertically between fin structures 109 (e.g., opposing side surfaces of remaining portions of the electrically insulative material 104 and the conductive material 106 of the stack 103). In particular, material may be removed from each of the electrically insulative material 104 and the conductive material 106 in a central portion of the stack 103, with sidewalls of the remaining electrically insulative material 104 and the conductive material 106 defining the central opening 108. Additional portions of the electrically insulative material 104 and the conductive material 106 may also remain at a contact region 112 on a longitudinal end of the stack 103. In some embodiments, the contact region 112 may be on only one (e.g., a single) longitudinal end of the stack 103, without being on an opposing longitudinal end of the stack 103. In some embodiments, elongated portions of each of the electrically insulative material 104 and conductive material 106 extend in a first direction (e.g., the X-direction) and the contact region 112 connecting the fin structures 109 extends in a second direction (e.g., the Y-direction). Accordingly, the electrically insulative material 104 and conductive material 106 of the stack 103 may exhibit a substantially U-shaped configuration, as shown in FIG. 2A. The central opening 108 may be formed using one or more conventional patterning and material removal processes, such as conventional photolithographic exposure processes, conventional development processes, conventional etching processes and conventional processing equipment, which are not described in detail herein.

An electrically insulative material 110 may be disposed within the central opening 108. The electrically insulative material 110 may be formed through one or more conventional conformal deposition processes or non-conformal deposition processes (e.g., a PVD process, a CVD process, ALD process, a spin-coating process). The electrically insulative material 110 may substantially entirely fill the central opening 108 extending between the fin structures 109. In some embodiments, the electrically insulative material 110 is located adjacent (e.g., over) an upper surface of the base material 102 and may extend vertically to an upper surface of the stack 103.

The electrically insulative material 110 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric oxycarbide material (e.g., $SiO_xC_z$), at least one dielectric carboxynitride material (e.g., $SiO_xC_zN_y$), and amorphous carbon. In some embodiments, the electrically insulative material 110 comprises a silicon dioxide material. In some embodiments, the electrically insulative material 110 comprises substantially the same material composition as the electrically insulative material 104. Accordingly, the electrically insulative material 110 and the electrically insulative material 104 thereof may comprise a unitary insulative material, which may correspond to the electrically insulative material 104. Although FIGS. 2A through 7A illustrate the electrically insulative material 104 and the electrically insulative material 110 as separate components, it will be understood that the electrically insulative material 104 and the electrically insulative material 110 may comprise a unitary structure exhibiting a substantially uniform composition (e.g., silicon dioxide).

Upper surfaces of the electrically insulative material 110 and the uppermost electrically insulative material 104 may be planarized, such as by one or more CMP acts following formation of the electrically insulative material 110 to facilitate or enhance the planarity of an upper boundary (e.g., upper surface) of the electrically insulative material 110 and the electrically insulative material 104 for further processing thereon. Accordingly, upper surfaces of the electrically insulative material 110 and the uppermost electrically insulative material 104 may be substantially coplanar with one another.

Figure 3A:
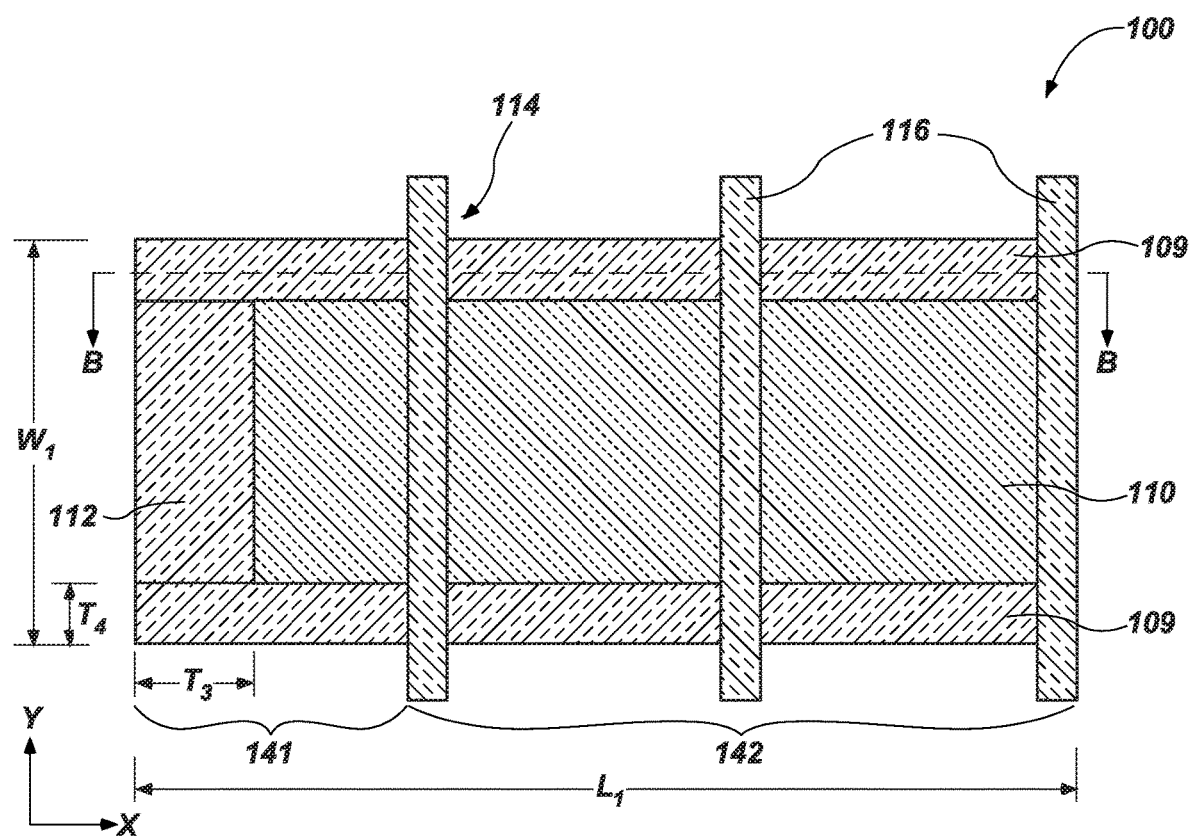
Figure 3B:
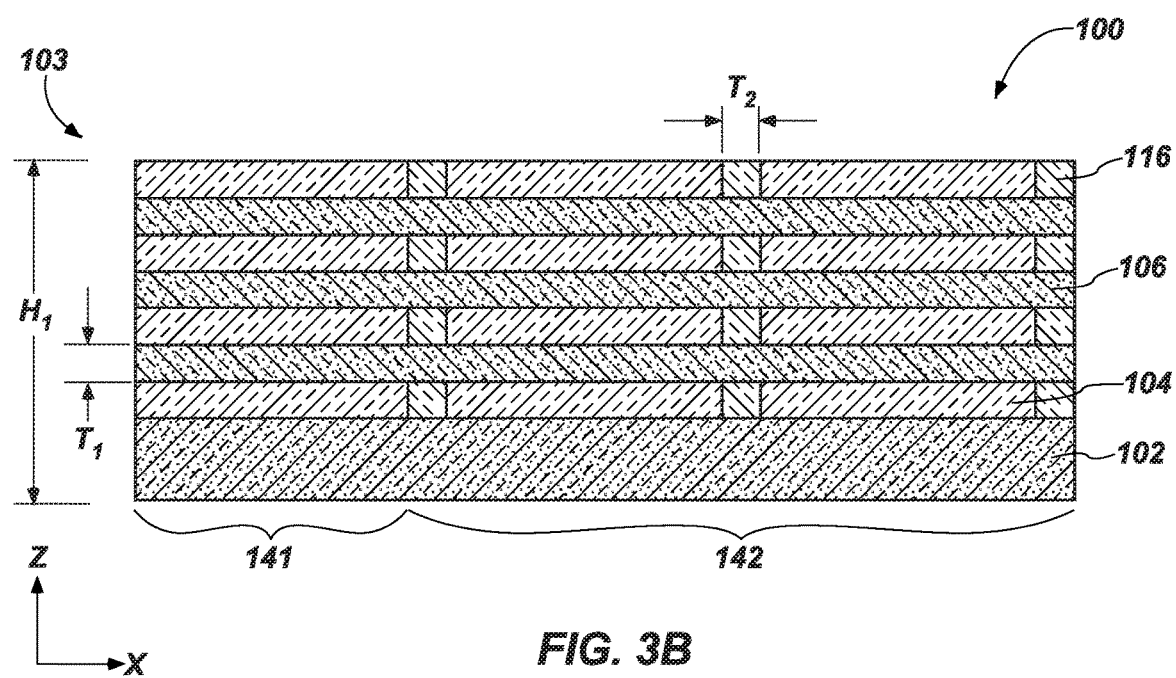

With reference to FIGS. 3A and 3B, openings 114 may be formed extending vertically through the electrically insulative material 110 and the electrically insulative material 104, without extending through the conductive material 106. In particular, material may be selectively removed from each of the electrically insulative material 104 and the electrically insulative material 110, without removing material from the conductive material 106. For example, portions of the electrically insulative material 104 and the electrically insulative material 110 between adjacent (e.g., vertically adjacent) portions of the conductive material 106 may be selectively removed by exposing portions of the electrically insulative material 104 and the electrically insulative material 110 between the conductive material 106 to a suitable etch chemistry, such as to wet etch or dry etch chemistries formulated and configured to remove portions of the electrically insulative material 104 and the electrically insulative material 110 without substantially removing portions of the conductive material 106. By way of non-limiting example, an anisotropic etch may be performed using one or more of a so-called "hole mask" (not shown) to form initial openings extending vertically through the stack 103 to the base material 102, followed by an isotropic etch to remove portions of the electrically insulative material 104 between the vertically adjacent portions of the conductive material 106.

A material of support structures 116 may be disposed within the openings 114. The support structures 116 may be formed using one or more conformal deposition processes or non-conformal deposition processes (e.g., a PVD process, a CVD process, ALD process, a spin-coating process). The material of the support structures 116 may substantially entirely fill the openings 114 extending in lines in the second direction (e.g., the Y-direction), as illustrated in FIG. 3A. In some embodiments, the support structures 116 extend (e.g., substantially fully extend) between upper surfaces of individual portions of the conductive material 106 and lower surfaces of vertically adjacent portions of the conductive material 106, as shown in FIG. 3B. The support structures 116 may define a first region 141 and a second region 142 of the stack 103. In particular, one of the support structures 116 adjacent (e.g., proximal) the contact region 112 may separate the first region 141 from the second region 142 along a longitudinal length of the device structure 100 in the first direction (e.g., the X-direction), as illustrated in FIGS. 3A and 3B. In some embodiments, the first region 141 may be characterized as a so-called "access device region" and the second region 142 may be characterized as a so-called "capacitor region," as will be discussed in greater detail below. For clarity and ease of understanding the drawings and associated description, only three support structures 116 are illustrated in the second region 142 in FIGS. 3A and 3B. However, the disclosure is not so limited, and additional support structures 116 may be included depending on the length and mechanical integrity of the fin structures 109. It will be understood that in at least some embodiments, the device structure 100 includes a single contact region 112 in the first region 141 and any number of support structures 116 in the second region 142.

A width $W_1$ of the stack 103 (e.g., a combined width of the fin structures 109 and the electrically insulative material 110 in the Y-direction) may be between about 10 nm and about 200 nm, such as between about 10 nm and about 20 nm, between about 20 nm and about 30 nm, between about 30 nm and about 50 nm, or between about 50 nm and about 200 nm. A length Li of the stack 103 (e.g., a length of the fin structures 109 in the X-direction) may be between about 300 nm and about 3000 nm, such as between about 300 nm and about 1000 nm, between about 1000 nm and about 1500 nm, or between about 1500 nm and about 3000 nm. A height Hi of the stack 103 (e.g., a combined height of the base material 102, the electrically insulative materials 104, and the conductive materials 106 in the Z-direction) may be between about 100 nm and about 3000 nm, such as between about 100 nm and about 1000 nm, between about 1000 nm and about 1500 nm, or between about 1500 nm and about 3000 nm. In some embodiments, an aspect ratio (i.e., ratio of height to width) of the device structure 100 may be between about 10:1 and about 100:1, such as about 33:1.

Further, a thickness $T_1$ of the conductive material 106 (e.g., in the Z-direction) may be between about 5 nm and about 40 nm, such as between about 5 nm and about 10 nm, between about 10 nm and about 20 nm, between about 20 nm and about 30, or between about 30 nm and about 40 nm. By way of non-limiting example, a pitch between vertically adjacent portions of the conductive material 106 may be between about 20 nm and about 100 nm, such as between about 20 nm and about 60 nm, or between about 60 nm and about 100 nm. In some embodiments, a minimum pitch between the vertically adjacent portions of the conductive material 106 may be between about 10 nm and about 20 nm greater than the thickness $T_1$ thereof. In some embodiments, a thickness $T_2$ of the support structures 116 (e.g., in the X-direction) may be between about 10 nm and about 60 nm, such as between about 10 nm and about 20 nm, between about 20 nm and about 30 nm, between about 30 nm and about 40 nm, between about 40 nm and about 50 nm, or between about 50 nm and about 60 nm. In some embodiments, a thickness $T_3$ of the contact region 112 (e.g., in the X-direction) may be relatively greater than the thickness $T_2$ of the support structures 116 (e.g., in the X-direction) and relatively greater than a thickness $T_4$ of the fin structures 109 (e.g., in the Y-direction).

The support structures 116 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric oxycarbide material (e.g., $SiO_xC_z$), at least one dielectric carboxynitride material (e.g., $SiO_xC_zN_y$), and amorphous carbon. In some embodiments, the support structures 116 comprise a silicon nitride material. In other embodiments, the support structures 116 comprise an oxynitride material. The dielectric material of the support structures 116 may be selectively etchable relative to the electrically insulative material 104 and the electrically insulative material 110.

Figure 4A:
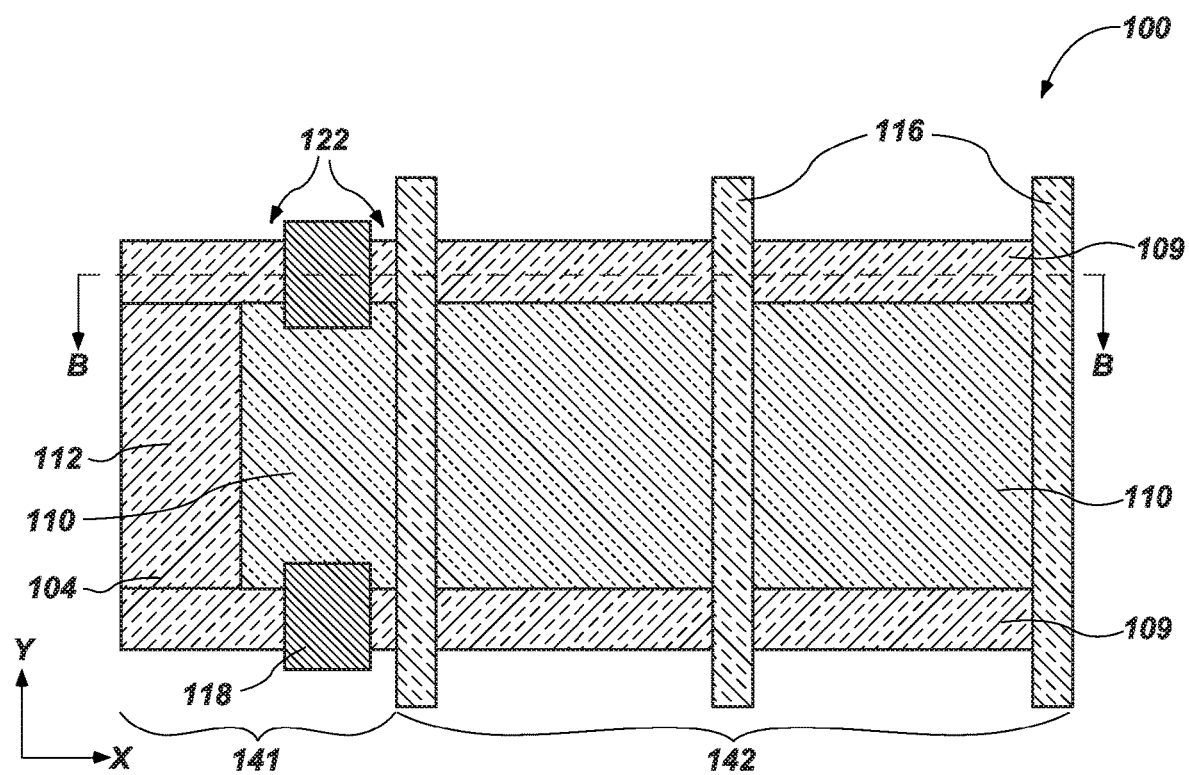
Figure 4B:
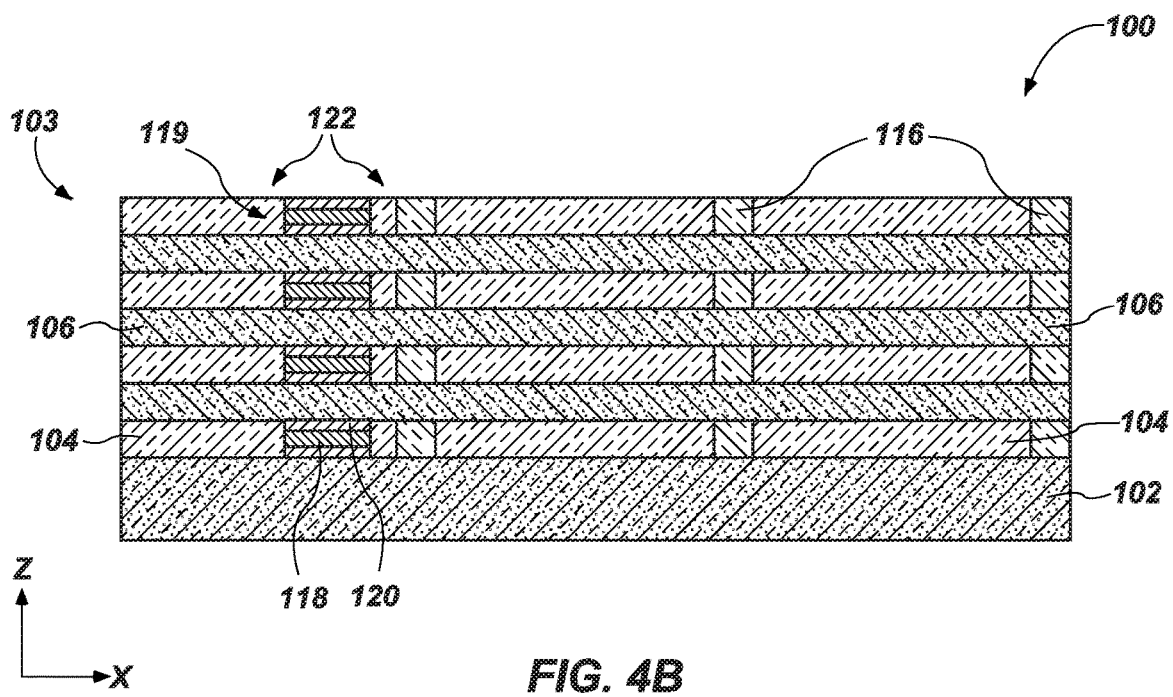

With reference to FIGS. 4A and 4B, one or more gate electrodes 118 may be formed adjacent (e.g., on, around) the fin structures 109. For example, a single gate electrode 118 may be formed on individual conductive materials 106 of the fin structures 109 (e.g., the two opposing fin structures 109). Openings (not shown) may be formed in each of the electrically insulative material 104 and the electrically insulative material 110 within the first region 141 by one or more material removal processes in order to form the gate electrodes 118 adjacent to the conductive material 106 of the fin structures 109. By way of non-limiting example, an anisotropic etch may be performed using a mask (not shown) to form initial openings extending vertically through the stack 103 to the base material 102, followed by an isotropic etch to remove portions of the electrically insulative material 104 between the vertically adjacent portions of the conductive material 106. In some embodiments, individual gate electrodes 118 are formed around (e.g., substantially surrounding) the conductive material 106 of a respective level thereof near a longitudinal end of the fin structures 109. As shown in FIG. 4A, the gate electrodes 118 may be formed within the first region 141 between the contact region 112 and one of the support structures 116 proximate the contact region 112.

The gate electrodes 118 may be surrounded on at least some sides thereof by a gate dielectric material 120. The gate dielectric material 120 may be formed adjacent to (e.g., above, below) the individual levels of the conductive material 106 and may be formed prior to forming the gate electrodes 118. Accordingly, at least a portion of the gate dielectric material 120 may be located between the conductive material 106 and a respective gate electrode 118. The gate electrodes 118 may be configured as a portion of a wordline extending in a third direction (e.g., the Z-direction), as discussed in greater detail below. In some embodiments, individual U-shaped structures of the device structure 100 include one or more (e.g., two) of the gate electrodes 118. The gate electrodes 118 may include an electrically conductive material such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrOx), ruthenium oxide (RuOx), alloys thereof, a conductively-doped semiconductor material (e.g., conductively doped silicon, conductively-doped germanium, conductively-doped silicon germanium, etc.), polysilicon, other materials exhibiting electrical conductivity, or combinations thereof.

The gate dielectric material 120 may be disposed around at least some sides of individual gate electrodes 118. In some embodiments, the gate electrodes 118 are substantially surrounded on all sides thereof (e.g., above, below, left, right, front, back, etc.) with the gate dielectric material 120. The gate dielectric material 120 may comprise one or more electrically insulative materials, such as, for example, phosphosilicate glass, borosilicate glass, borophosphosilicate glass (BPSG), fluorosilicate glass, silicon dioxide, magnesium oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN)), a dielectric carboxynitride material (e.g., silicon carboxynitride (SiOCN)), high-k dielectric materials (e.g., aluminum oxide ($Al_2O_3$), tantalum oxide ($Ta_2O_5$), zirconium oxide ($ZrO_2$), hafnium oxide ($HfO_2$), lanthanum oxide ($La_2O_3$), titanium oxide ($TiO_2$)), another material, or combinations thereof. In some embodiments, the gate dielectric material 120 comprises silicon dioxide. In some embodiments, the gate dielectric material 120 comprises substantially the same material composition as the electrically insulative material 104. Accordingly, the gate dielectric material 120 and the electrically insulative material 104 thereof may comprise a unitary insulative material, which may correspond to the electrically insulative material 104.

Access devices 119 (e.g., transistors) may be formed from a portion of the conductive material 106 adjacent to the gate electrodes 118. The access devices 119 may be formed proximate intersections of two conductive materials (e.g., a data line and an access line), as discussed in greater detail with reference to FIG. 8. In embodiments including the gate electrodes 118 being formed to substantially surround the individual conductive materials 106 in the first region 141, the access devices 119 may be characterized as so-called "gate-all-around transistors." In some embodiments, the gate electrodes 118 and, thus, the access devices 119 are isolated (e.g., physically isolated) from the support structures 116 and/or the contact region 112 by isolation regions 122 (e.g., gaps between adjacent structures). In other words, the gate electrodes 118 may not be directly adjacent to at least one of the support structures 116 or the contact region 112 to form adjacent structures. In other embodiments, the gate electrodes 118 may be directly adjacent to the support structures 116 and/or the contact region 112.

Figure 5A:
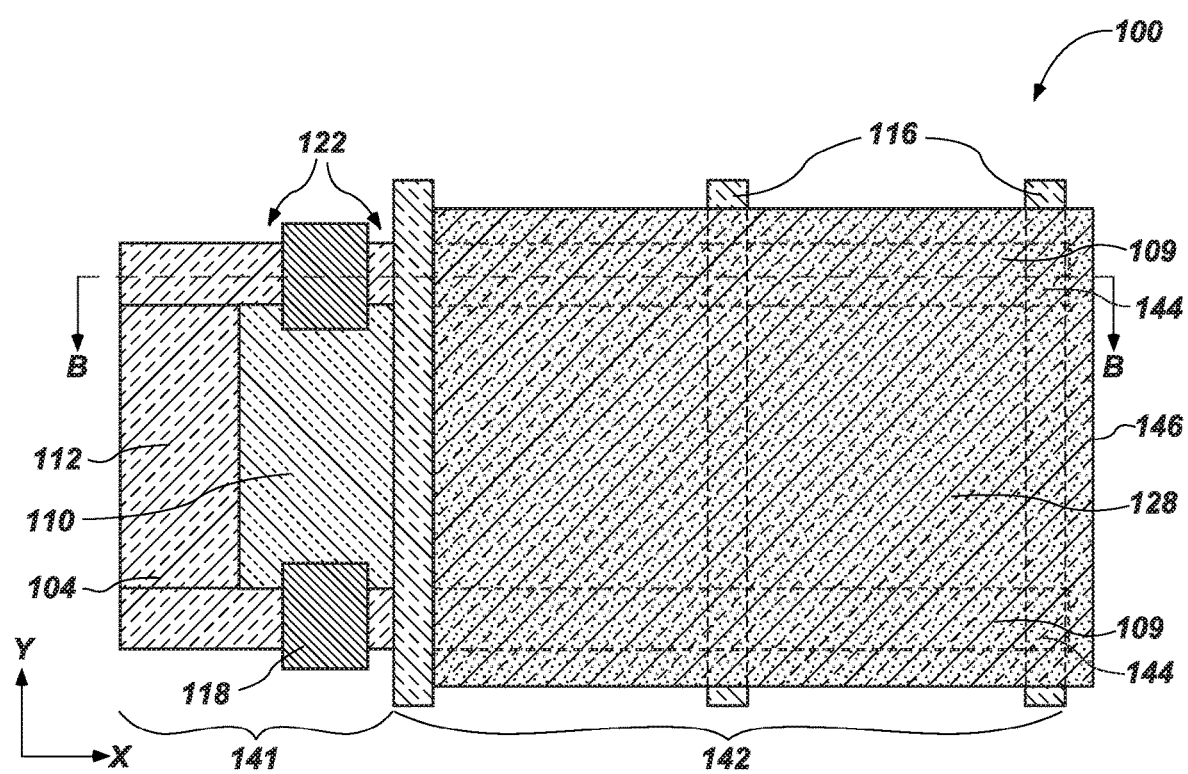
Figure 5B:
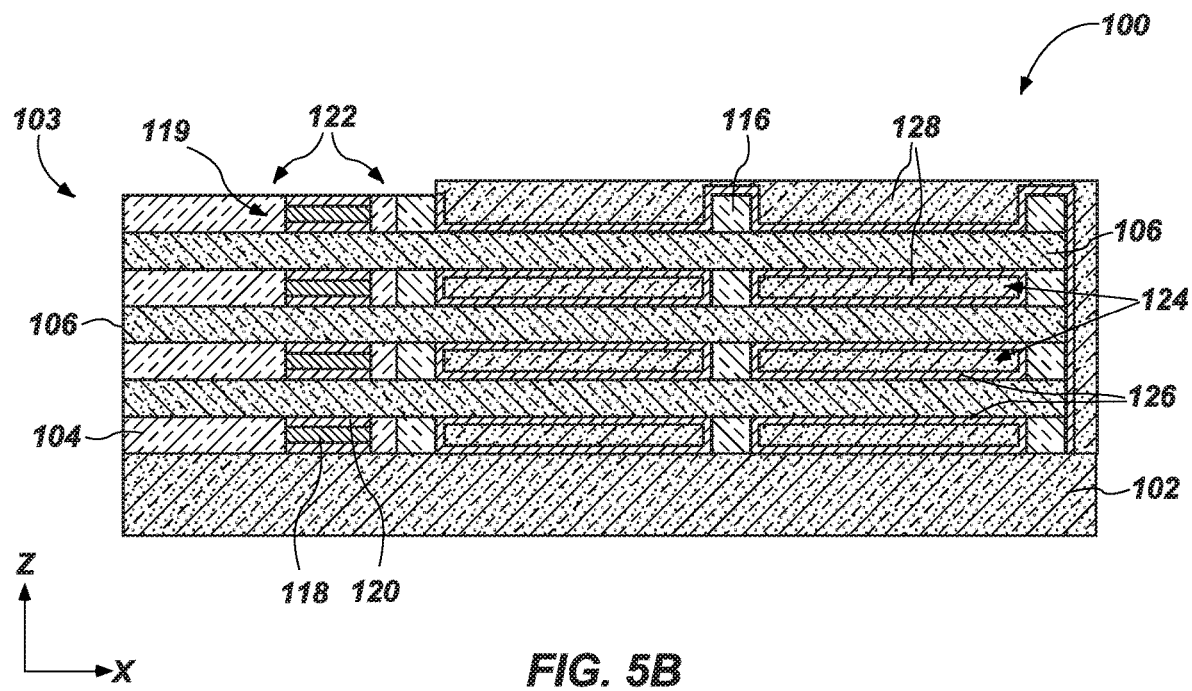

With reference to FIGS. 5A and 5B, openings 124 may be formed between vertically adjacent portions of the individual conductive materials 106 in the second region 142. In some embodiments, portions of each of the electrically insulative material 104 and the electrically insulative material 110 remain in the first region 141, as shown in FIGS. 5A and 5B. The contact region 112 and the access devices 119 in the first region 141 may be protected (e.g., covered, not exposed) during formation of the openings 124. In some such embodiments, substantially entire portions of each of the electrically insulative material 104 and the electrically insulative material 110 may be removed within the second region 142. In particular, material may be selectively removed from each of the electrically insulative material 104 and the electrically insulative material 110, without removing material from the conductive material 106 and the support structures 116. To remove the electrically insulative material 104 and the electrically insulative material 110 in the second region 142, one or more material removal processes may be performed to selectively remove portions of the materials and form the openings 124 (e.g., undercuts) between vertically adjacent portions of the conductive material 106 without substantially removing portions of the conductive material 106 and the support structures 116. By way of non-limiting example, an anisotropic etch may be performed using a mask (not shown) to form initial openings extending vertically through the stack 103 to the base material 102, followed by an isotropic etch to remove portions of the electrically insulative material 104 between the vertically adjacent portions of the conductive material 106. In some embodiments, the gate electrodes 118 and the gate dielectric material 120 are formed in the first region 141 prior to forming the openings 124 in the second region 142, as described above. Alternatively, the openings 124 may be formed prior to forming the gate electrodes 118 and the gate dielectric material 120.

A capacitor dielectric material 126 may be disposed within the openings 124 adjacent to (e.g., overlying, underlying) the conductive material 106 of the fin structures 109 (shown in dashed lines in FIG. 5A for clarity). Dielectric materials may be formed and patterned by conventional techniques to form the capacitor dielectric material 126. In some embodiments, the capacitor dielectric material 126 is formed (e.g., conformally formed through an ALD process) adjacent to the conductive material 106 and at least some of the support structures 116 without fully filling the openings 124 between the adjacent portions of the conductive material 106. For example, the capacitor dielectric material 126 may be conformally formed on exposed lower surfaces and exposed upper surfaces of the conductive material 106 and may at least partially (e.g., substantially) cover the exposed surfaces of the conductive material 106. The capacitor dielectric material 126 may comprise one or more electrically insulative materials, such as, for example, phosphosilicate glass, borosilicate glass, borophosphosilicate glass (BPSG), fluorosilicate glass, silicon dioxide, magnesium oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN)), a dielectric carboxynitride material (e.g., silicon carboxynitride (SiOCN)), high-k dielectric materials (e.g., aluminum oxide ($Al_2O_3$), tantalum oxide ($Ta_2O_5$), zirconium oxide ($ZrO_2$), hafnium oxide ($HfO_2$), lanthanum oxide ($La_2O_3$), titanium oxide ($TiO_2$)), another material, or combinations thereof. In some embodiments, the capacitor dielectric material 126 comprises silicon dioxide. In some embodiments, the capacitor dielectric material 126 is formed of and includes substantially the same material composition as the electrically insulative material 104 and/or the gate dielectric material 120.

A conductive material 128 may be formed adjacent to and in contact (e.g., direct physical contact) with the capacitor dielectric material 126 within the openings 124. As shown in FIG. 5B, the conductive material 128 may at least partially (e.g., substantially) cover upper surfaces of the capacitor dielectric material 126. In other words, the conductive material 128 may substantially fill the remainder of the openings 124. The conductive material 128 may be configured as one electrode (e.g., a top electrode) of stacked horizontal capacitor structures 144 and the conductive material 106 of the fin structures 109 may comprise the other of the electrodes (e.g., a bottom electrode). In some embodiments, the conductive material 128 comprises a single, continuous material connecting at least some of the adjacent capacitor structures 144. In other words, the conductive material 128 of one horizontal capacitor structure may be coextensive with the conductive material 128 of an adjacent horizontal capacitor structure. In some embodiments, the conductive material 128 is formed of and includes substantially the same material composition as the conductive material 106 described above with reference to FIGS. 1A and 1B. The conductive material 128 may include a single conductive material or may include more than one conductive material. For example, the conductive material 128 may include a semiconductor material, such as one or more of silicon germanium, germanium, and polysilicon. The semiconductor material may be undoped, or may include one or more dopants, such as p-type dopants or n-type dopants.

As shown in FIGS. 5A and 5B, portions of the capacitor dielectric material 126 and/or the conductive material 128 may be formed in the second region 142 and extend to an end region 146 (e.g., beyond the support structure 116 that is located farthest from the contact region 112). In other words, at least one of the capacitor dielectric material 126 or the conductive material 128 may extend beyond the support structure 116 located distal from the contact region 112, with the contact region 112 and the end region 146 being at opposing longitudinal ends of the device structure 100. In some embodiments, at least a portion of the conductive material 128 is formed adjacent to (e.g., overlying) the base material 102. In other embodiments, the support structure 116 located distal from the contact region 112 may coincide with (e.g., define) the end region 146 of the device structure 100, without any materials extending beyond the farthest support structure 116. Formation of the capacitor dielectric material 126 and conductive material 128 results in formation of so-called "stacked horizontal capacitor structures" according to embodiments of the disclosure. For clarity and ease of understanding the drawings and associated description, only three conductive materials 106 and four conductive materials 128 (e.g., of the capacitor structures 144) are illustrated in the second region 142 in FIG. 5B. However, the disclosure is not so limited, and the device structure 100 according to embodiments of the disclosure may have any number of the capacitor structures 144, such as at least 10, 25, 50, 75, or 100 of the capacitor structures 144, by way of non-limiting examples. In some embodiments, the device structure 100 may include between about 10 of the capacitor structures 144 and about 100 of the capacitor structures 144 (e.g., about 50 of the capacitor structures 144).

Figure 6A:
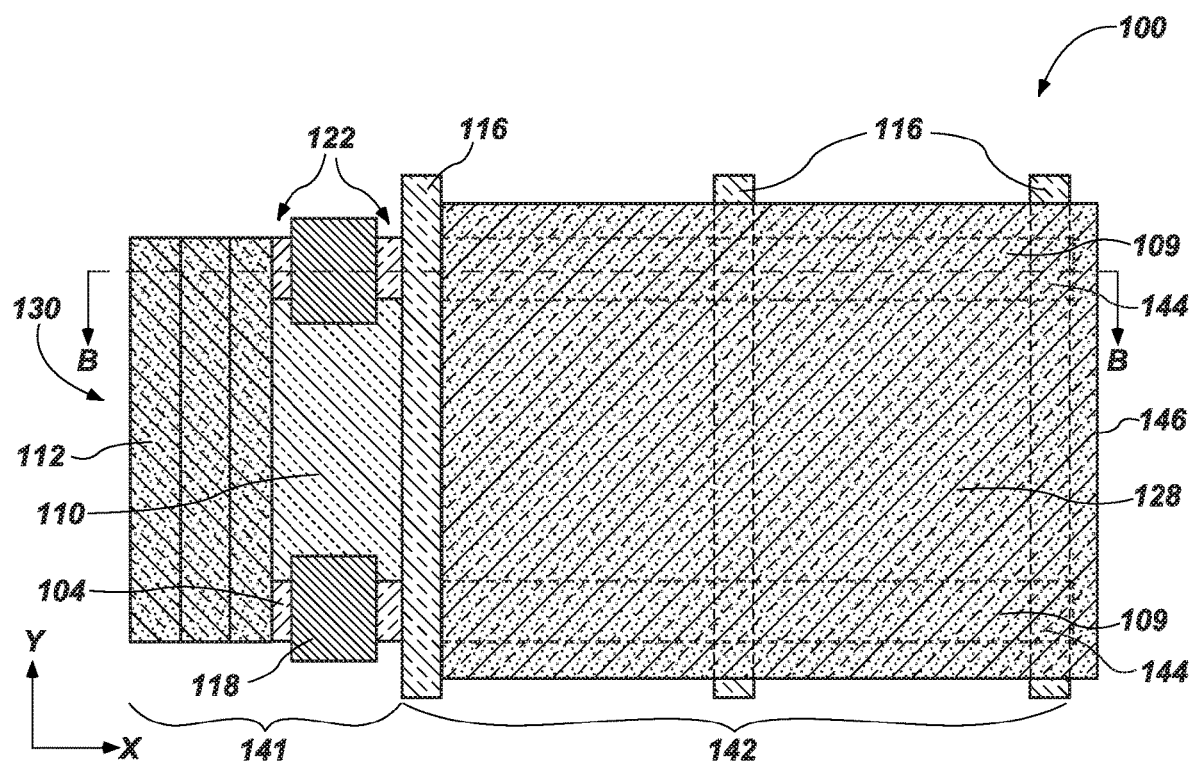
Figure 6B:
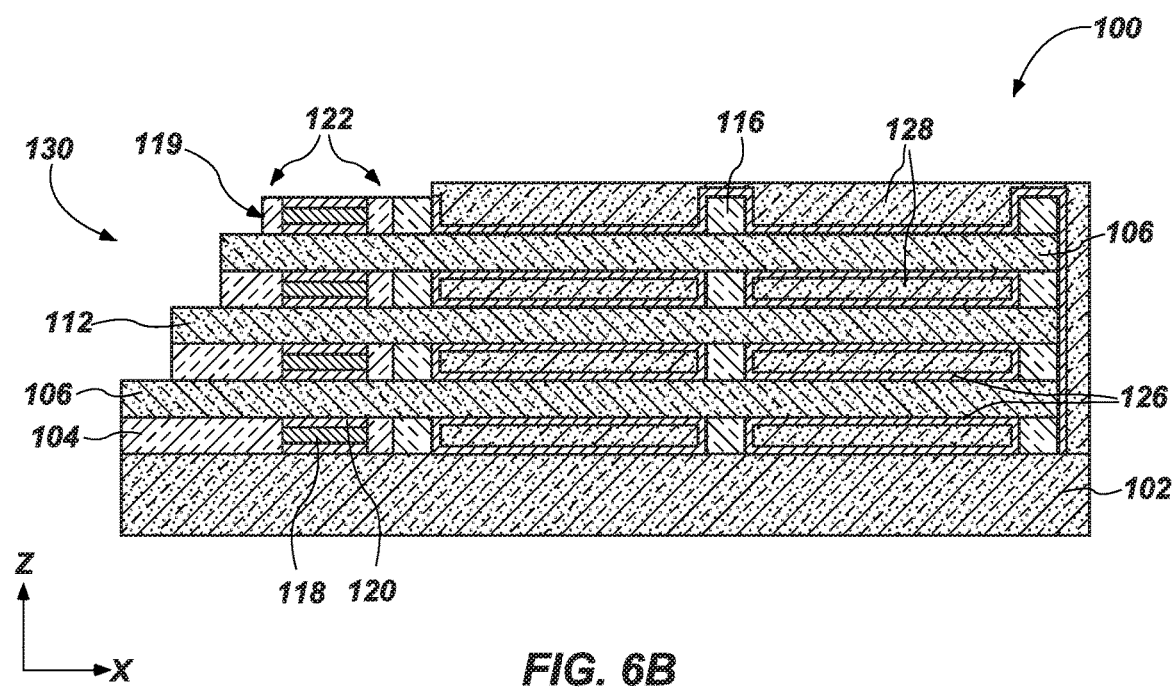

With reference to FIGS. 6A and 6B, a staircase structure 130 may be formed at one or both longitudinal ends of the device structure 100, such as within or proximate the contact region 112 of the first region 141. In some such embodiments, the staircase structure 130 is formed on a side of the gate electrodes 118 opposite the second region 142. The staircase structure 130 may be isolated (e.g., physically isolated) from the gate electrodes 118 by the isolation regions 122 such that the gate electrodes 118 are not directly adjacent to the staircase structure 130 to form the staircase structure 130 and/or the gate electrodes 118. In some embodiments, the gate electrodes 118 and the gate dielectric material 120 are formed prior to forming the staircase structure 130, as described above. Alternatively, the staircase structure 130 may be formed prior to forming the gate electrodes 118 and the gate dielectric material 120, as well as the materials (e.g., the capacitor dielectric material 126 and the conductive material 128) of the second region 142.

The staircase structure 130 may be formed by conventional techniques. Stair step structures for electrical connection to conductive lines (e.g., the conductive material 106) of the capacitor structures 144 may be formed by utilizing a so-called "stair step mask" and, optionally, one or more so-called "chop masks." A stair step mask (not shown) may be formed over the contact region 112 of the device structure 100 while leaving one step-width (e.g., a width of one contact region extending in the longitudinal X-direction) exposed. One or more levels of conductive material (e.g., the conductive material 106) exposed through the stair step mask may be removed, such as by a first anisotropic material removal (e.g., etching) act. An edge of the stair step mask may be removed to recess the edge of the stair step mask and to expose another step-width, in addition to the original exposed step-width. Another material removal act may be performed to remove another one or more conductive material exposed through the recessed stair step mask. The process may be repeated to form a desired number of contact regions also referred to as "stairs" or "stair step structures." Each of the stair step structures (e.g., common contact pads) may include a portion of the conductive material 106 on an upper portion thereof. Stated another way, the conductive material 106 may be exposed on an upper surface of each of the stair step structures, as shown in FIG. 6B. The material removal (e.g., etching) acts may expose rows of the conductive materials 106. Portions of the electrically insulative material 110 within the first region 141 may or may not be removed during formation of the staircase structure 130.

Figure 7A:
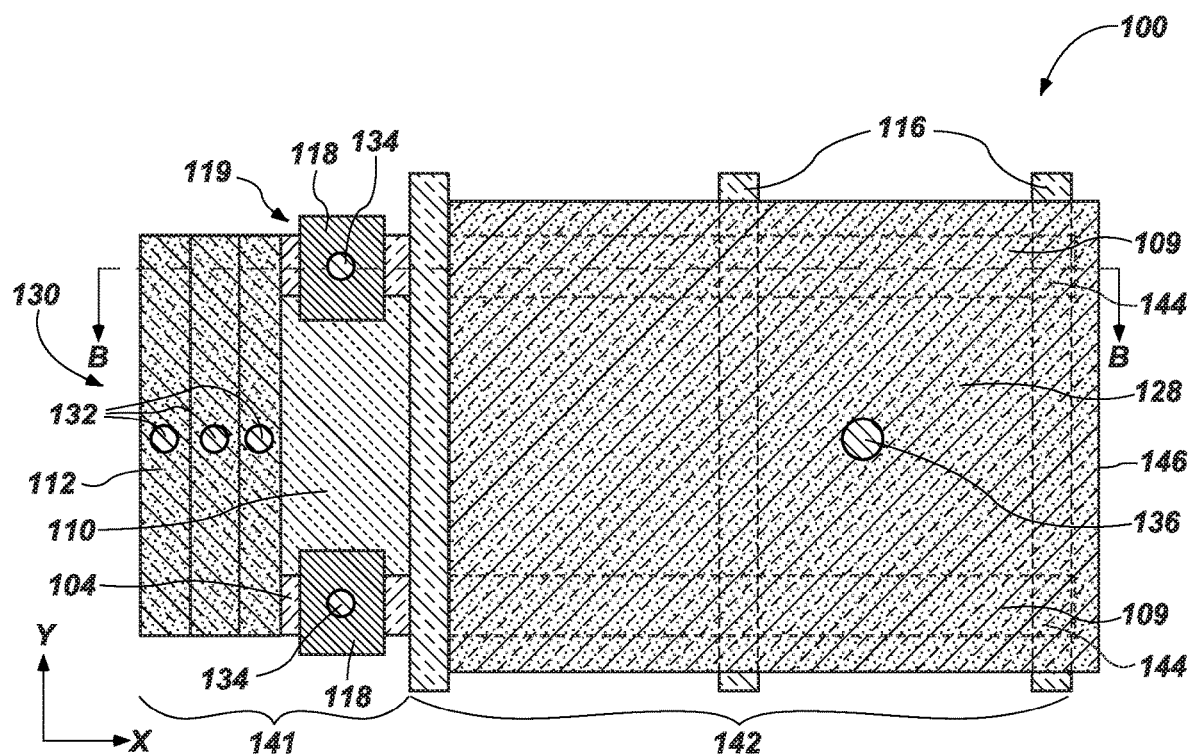
Figure 7B:
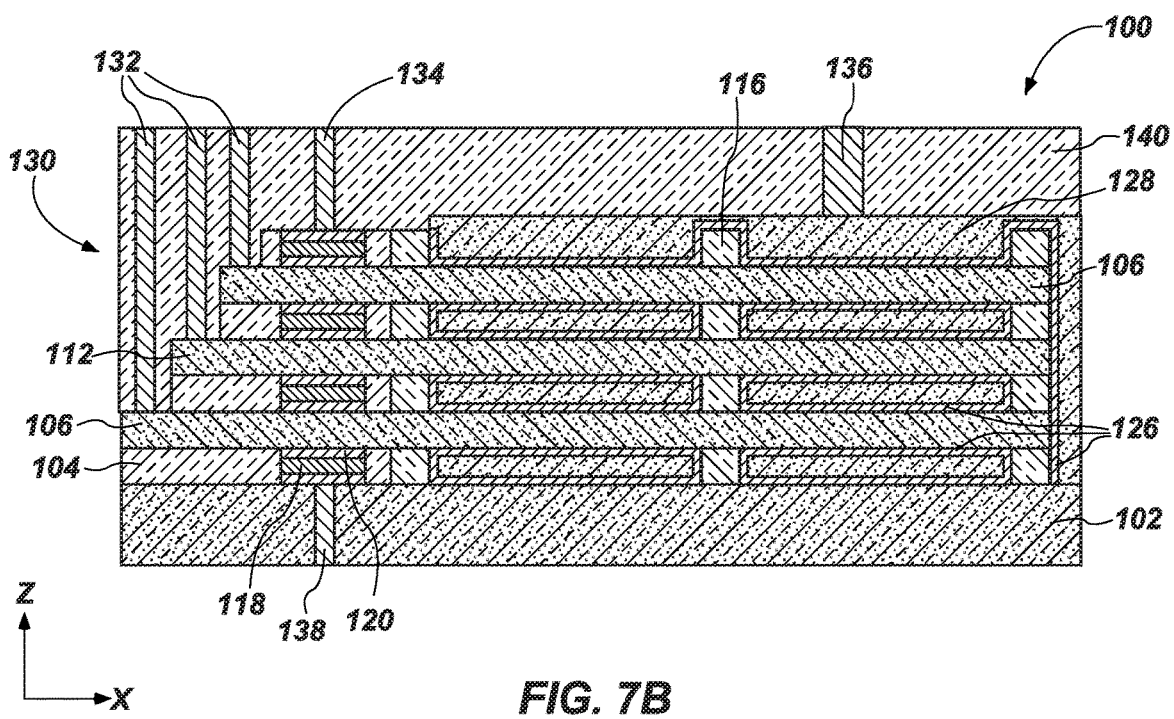

With reference to FIGS. 7A and 7B, an electrically insulative material 140 may be disposed over the device structure 100, as shown in FIG. 7B. For clarity and ease of understanding the drawings and associated description, the electrically insulative material 140 is absent in FIG. 7A. The electrically insulative material 140 may be formed through one or more conventional deposition processes (e.g., a PVD process, a CVD process, ALD process, a spin-coating process). The electrically insulative material 140 may be formed over each of the first region 141 and the second region 142, as shown in FIG. 7B. However, the disclosure is not so limited and the electrically insulative material 140 may be formed over only one of the first region 141 or the second region 142 or, alternatively, over designated locations responsive to subsequent locations of additional structures. In some embodiments, the electrically insulative material 140 is located adjacent (e.g., over) exposed upper surfaces of dielectric materials (e.g., the electrically insulative material 104, the support structures 116) as well as adjacent (e.g., over) exposed upper surfaces of conductive materials (e.g., the conductive material 106, the gate electrodes 118, the conductive material 128). Upper surfaces of the electrically insulative material 140 may be planarized, such as by one or more CMP acts to facilitate or enhance the planarity of an upper boundary (e.g., upper surface) of the electrically insulative material 140 for further processing thereon.

The electrically insulative material 140 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric oxycarbide material (e.g., $SiO_xC_z$), at least one dielectric carboxynitride material (e.g., $SiO_xC_zN_y$), and amorphous carbon. In some embodiments, the electrically insulative material 140 comprises a silicon dioxide material. In some embodiments, the electrically insulative material 140 comprises substantially the same material composition as the electrically insulative material 104. Accordingly, the electrically insulative material 140 and the electrically insulative material 104 thereof may include a unitary insulative material, which may correspond to the electrically insulative material 104.

Following formation of the electrically insulative material 140, one or more contacts (e.g., conductive contacts 132, conductive contacts 134, upper conductive contacts 136) may be formed in openings of the electrically insulative material 140 to physically and electrically contact the respective conductive materials. The openings and the contacts may be formed by conventional techniques. For example, the conductive contacts 132 (e.g., data line contacts) may be formed between the conductive materials 106 of the staircase structure 130 and other conductive elements (not shown). In some embodiments, the conductive contacts 132 are centrally located on individual stair step structures of the staircase structure 130. However, the disclosure is not so limited and the conductive contacts 132 may be arranged in a pattern different than that illustrated in FIG. 7A. In addition, multiple conductive contacts 132 may be present on each stair step structure of the staircase structure 130. The conductive contacts 134 (e.g., wordline contacts) may be formed between the gate electrodes 118 and other conductive elements, for example, and the upper conductive contacts 136 may be formed between the uppermost conductive material 128 (e.g., the top electrode of the capacitor structures 144) and other conductive elements. In some embodiments, the uppermost conductive material 128 is connected by one or more (e.g., a single) upper conductive contact 136. In other embodiments, the upper conductive contacts 136 include additional portions thereof and/or may be arranged in a pattern different than that illustrated in FIGS. 7A and 7B. Although the conductive contacts 132 and upper conductive contacts 136 do not fall along the line B-B of FIG. 7A, representative portions of the conductive contacts 132 and the upper conductive contacts 136 are shown in FIG. 7B for clarity. A lower conductive contact 138 may, optionally, be formed within the base material 102 and extend between a lower portion of the gate electrodes 118 and other conductive elements (not shown) underlying the base material 102. For example, the device structure 100 may overlie a complementary metal-oxide-semiconductor (CMOS) region, such as CMOS under array (CUA) region, as described in greater detail with reference to FIG. 18.

One or more (e.g., each) of the conductive contacts 132, the conductive contacts 134, the upper conductive contacts 136, and the lower conductive contact 138 may be formed of a material exhibiting sufficient electrical conductivity to access the conductive material 106, the upper portion of the gate electrodes 118, the conductive material 128, and the lower portion of the gate electrodes 118, respectively, and to provide electrical communication between the conductive materials and the other conductive elements. By way of non-limiting example, the contacts are formed of and include aluminum, copper, nickel, chromium, cobalt, ruthenium, rhodium, palladium, silver, platinum, gold, iridium, tantalum, tungsten, conductive metal nitrides (e.g., TiN, TaN, WN, etc.), conductive metal silicides (e.g., tantalum silicides, tungsten silicides, nickel silicides, titanium silicides, etc.), polysilicon, and combinations thereof. In some embodiments, the contacts are formed of and include tungsten.

Figure 8:
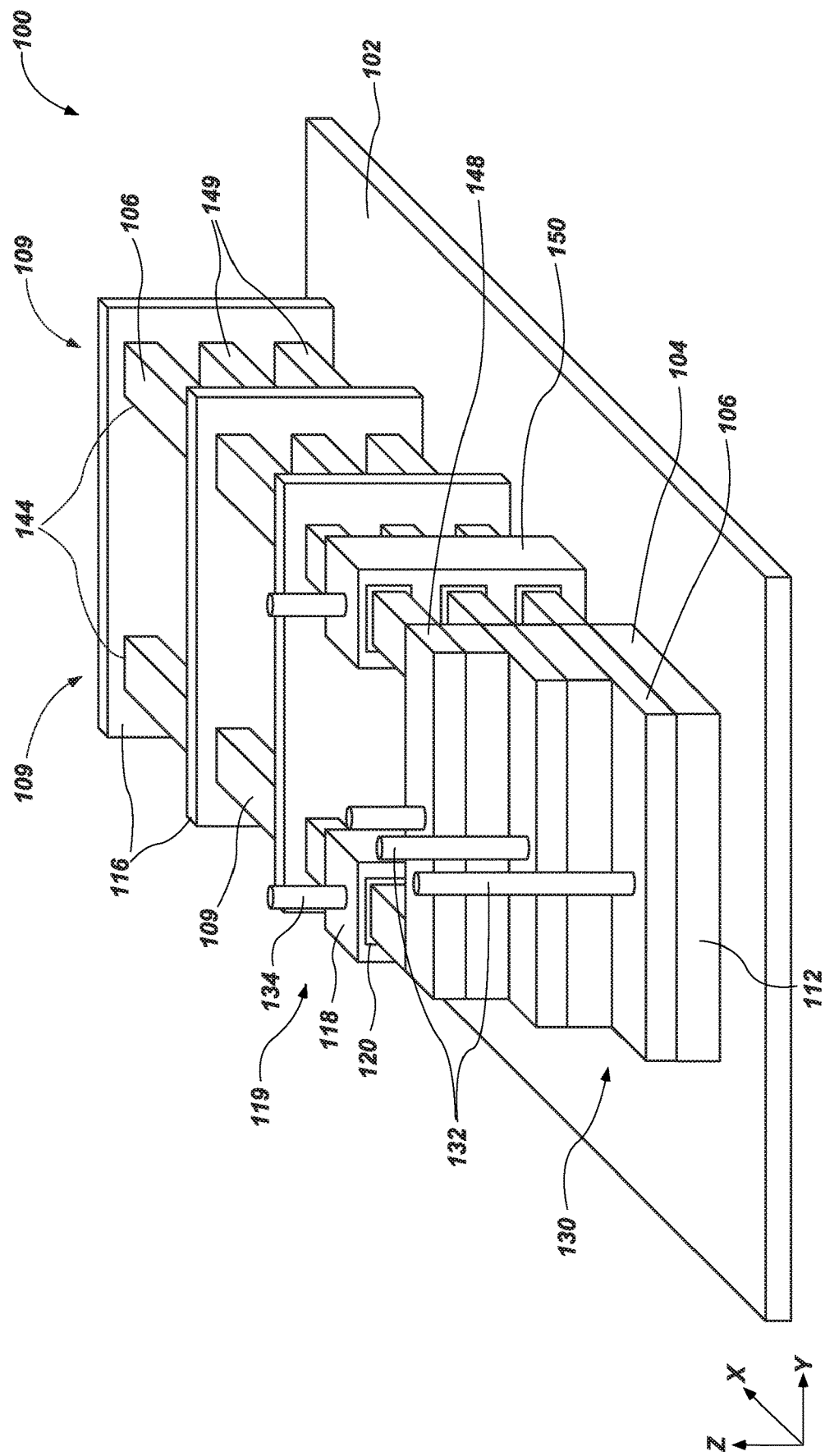
FIG. 8 is a simplified perspective view of the apparatus of FIGS. 1A through 7B, in accordance with embodiments of the disclosure.

FIG. 8 is a simplified perspective view of the apparatus including the device structure 100 of FIGS. 1A through 7B. For clarity and ease of understanding the drawings and associated description, surrounding materials including the electrically insulative material 110, the electrically insulative material 140, the capacitor dielectric material 126, and the conductive material 128 are absent from FIG. 8. The conductive materials 106 in the second region 142 form the individual capacitor structures 144 (e.g., capacitor containers) that are aligned horizontally and stacked vertically within the device structure 100. Each capacitor structure 144 includes a respective access device 119 on the same individual level of the conductive material 106. The capacitor structures 144 of may be connected with one another by the contact region 112 to exhibit the U-shaped configuration. In some embodiments, the capacitor structures 144 include two opposing fin structures 109 having elongated portions extending in a first direction (e.g., the X-direction) and a single contact region 112 connecting the fin structures 109 and extending therebetween in a second direction (e.g., the Y-direction), as shown in FIG. 8. As shown in FIG. 8, the device structure 100 includes three capacitor structures 144. However, additional capacitor structures 144 may be present in the Z-direction. Additional laterally adjacent capacitor structures 144 may extend continuously on either (e.g., each) lateral side thereof. Multiple levels (e.g., three levels shown for clarity) may be stacked in a third direction (e.g., the Z-direction), as illustrated in FIG. 8.

Portions of the conductive material 106 of the fin structures 109 may be configured as nanowires (e.g., junctionless nanowires 149) having elongated portions extending in the first direction. The junctionless nanowires 149 may be characterized as so-called "horizontal nanowires" comprising at least one dimension of less than about 50 nm. In some embodiments, the junctionless nanowires 149 comprise one or more conductive materials that are doped with dopants of the same polarity without forming p-n-p junctions, n-p-n junctions, for example. The associated access devices 119 may be characterized as so-called "junctionless nanowire transistors" (e.g., formed without the use of a source and drain implantation step). In other words, the junctionless nanowires 149 comprise a material (e.g., a doped polysilicon material) comprising one of a p-type dopant or an n-type dopant, without comprising the other of the p-type dopant or the n-type dopant. By way of non-limiting example, the junctionless nanowires 149 may be doped to either a p+ level (or to a p++ level) or, alternatively, to an n+ level (or to an n++ level) and, thus, may be relatively heavily doped relative to a p level dopant or an n level dopant, respectively. In some embodiments, the junctionless nanowires 149 comprise at least one of the electrodes (e.g., the bottom electrode) of individual capacitor structures 144.

The conductive material 106 of the contact region 112 may be configured as first conductive lines 148 (e.g., data lines, bit lines) extending in the second direction (e.g., the Y-direction). The gate electrodes 118 surrounding the individual conductive materials 106 may be connected by second conductive lines 150 (e.g., access lines, wordlines)

extending in the vertical direction that is substantially transverse (e.g., substantially perpendicular) to the horizontal direction of the first conductive lines 148. The gate dielectric material 120 may surround the conductive material 106, with the gate electrode 118 surrounding the gate dielectric material 120. As shown in FIG. 8, the second conductive lines 150 extend in a direction that is substantially transverse to a major plane of the base material 102. As a major plane of the conductive material 128 (FIG. 7B) is oriented parallel to the major plane of the base material 102, the second conductive lines 150 also extend in a direction that is substantially transverse to a major plane of the conductive material 128 of the capacitor structures 144. Since the second conductive lines 150 are oriented in a direction that is transverse to the major plane of the base material 102, the configuration of the device structure 100 differs from that of conventional device structures including data lines extending in a first horizontal direction, for example, and access lines extending in a second horizontal direction, transverse to the first horizontal direction of the data lines. Accordingly, the positions of each of the first conductive lines 148 and the second conductive lines 150 relative to existing structures (e.g., the base material 102) within the device structure 100, according to embodiments of the disclosure, differ from that of conventional device structures. By providing the capacitor structures 144 that are aligned horizontally (e.g., in the X-direction) and stacked vertically (e.g., in the Z-direction), such configurations may allow for improved density as devices (e.g., memory devices) are scaled down in size to increase the density of memory cells. Such improved density may result in reduced power consumption during use and operation of the apparatus. In contrast to conventional devices including vertically aligned capacitor structures, a footprint of the capacitor structures 144 according to embodiments of the disclosure may be reduced, without unduly reducing capacitance (e.g., without reducing an overall cross-sectional area) thereof as devices are scaled down in size. As a result, the RC (product of resistance and capacitance) of the capacitor structures 144 may be optimized (e.g., by varying dopant concentration), which may correlate to an increase in the performance thereof. Further, the configuration of the stacked horizontal capacitor structures 144 may allow improved electrical isolation between adjacent capacitor structures 144, which may result in reduced occurrences of bridging (e.g., electrical connection) between two or more adjacent capacitor structures 144, as well as reduced leakage during use and operation. In some instances, the bridging between adjacent structures of conventional devices may be the result of so-called "under etch" during fabrication. The bridging may be reduced (e.g., minimized) with the horizontal configuration of the capacitor structures 144, compared to only using conventional capacitor structures that are oriented vertically.

Since the access devices 119 may include material of the conductive material 106 of the fin structures 109, the access devices 119 may include material of the capacitor structures 144 (e.g., of the same junctionless nanowires 149) forming the individual fin structures 109. In other words, the conductive material 106 of the fin structures 109 of individual capacitor structures 144 may also be used as the conductive material for the access devices 119 located proximate intersections of the first conductive lines 148 and the second conductive lines 150. As the first conductive lines 148 also include the material of the conductive material 106 (e.g., within the contact region 112), the access devices 119 may also include the same material as that of the first conductive lines 148. Accordingly, the capacitor structures 144 aligned in a single vertical column share a common line (e.g., a common access line) of the second conductive lines 150. Each of the one or more (e.g., two) second conductive lines 150 and corresponding gate electrodes 118 of each conductive material 106 of the fin structures 109 may be connected by one or more (e.g., a single) conductive contact 134. Further, the individual capacitor structures 144 and respective access devices 119 of the individual conductive materials 106 share a common gate electrode 118.

Numerous advantages are achieved by utilizing the processes described above to form the device structure 100. The gate electrodes 118 surrounding the conductive material 106 of the fin structures 109 in a gate-all-around configuration may provide increased gate performance. By forming the stacked horizontal capacitor structures 144, the overall density for a given size of the devices may be increased, as compared to comparable sizes of conventional devices. Further, increased efficiency may be achieved by providing simplified process flows. For example, forming the first conductive lines 148 including the conductive material 106 within the contact region 112 of the stack 103 may allow simplified processes to form the stacked horizontal capacitor structures 144, which processes are unavailable in conventional devices having vertically oriented capacitor structures. Since the horizontal capacitor structures 144 are oriented horizontally, less buckling may be observed relative to conventional devices having vertically oriented capacitor structures. By utilizing the conductive material 106 of the fin structures 109 in the capacitor structures 144 as well as the access devices 119, manufacturing costs may be reduced.

With continued reference to FIG. 8, the support structures 116 may provide structural support to the fin structures 109 in the second region 142 (FIG. 7A) of the device structure 100. Any number of the support structures 116 may be present to provide structural stability within the device structure 100 along a longitudinal extent thereof. By way of non-limiting example, the device structure 100 may include between one (1) and five (5) of the support structures 116, such as three (3) of the support structures 116. In other embodiments, such as structures having a relatively shorter length of the fin structures 109, the device structure 100 may lack (e.g., be absent of) any support structures 116. The staircase structure 130 within the contact region 112 may also provide structural stability within the device structure 100.

The individual levels (e.g., stair step structures) of the staircase structure 130 provide step-wise electrical access to the conductive contacts 132 corresponding to individual capacitor structures 144. In other words, each exposed conductive material 106 of the staircase structure 130 provides access to one or more (e.g., a single) conductive contact 132 providing electrical connection to a respective first conductive line 148 of individual capacitor structures 144. The capacitor structures 144 of an individual level of the conductive material 106 may share a common contact pad (e.g., stair step structure) within the staircase structure 130. The configuration of the staircase structure 130 allows for contact formation to the individual levels of the conductive material 106 of the capacitor structures 144 extending in the first horizontal direction. Accordingly, the capacitor structures 144 on individual conductive materials 106 of the fin structures 109 share a common line (e.g., a common data line) of the first conductive lines 148, as well as one or more common conductive contacts 132. In some embodiments, each of the first conductive lines 148 of one of the capacitor structures 144 is connected by a single (e.g., one) conductive contact 132. Accordingly, decreasing a number of the conductive contacts (e.g., the conductive contacts 132, the conductive contacts 134), as well as decreasing a proximity between the conductive contacts and other conductive elements, may result in improved reliability and reduced power consumption during use and operation.

Thus, in accordance with embodiments of the disclosure, an apparatus comprises fin structures comprising individual levels of a conductive material having elongated portions extending in a first horizontal direction, first conductive lines extending in a second horizontal direction transverse to the first horizontal direction, and second conductive lines extending in a vertical direction transverse to each of the first horizontal direction and the second horizontal direction. At least portions of the first conductive lines are aligned vertically. The apparatus also comprises horizontal capacitor structures comprising the conductive material of the fin structures and access devices proximate intersections of the first conductive lines and the second conductive lines. The access devices comprise the conductive material of the fin structures.

Moreover, in accordance with embodiments of the disclosure, a method of forming at least one opening vertically extending through a stack of alternating conductive materials and dielectric materials overlying a base material. Remaining portions of the alternating conductive materials and dielectric materials of the stack define fin structures extending in a first horizontal direction. The method comprises forming at least one gate structure adjacent the conductive materials of the fin structures and forming horizontal capacitor structures adjacent to individual levels of the conductive materials of the fin structures. The method further comprises forming at least one staircase structure comprising materials of the stack of alternating conductive materials and dielectric materials, forming an electrically insulative material overlying at least portions of the stack, and forming conductive contacts through openings in the electrically insulative material.

In additional embodiments of the disclosure, the features and feature configurations described above in relation to FIGS. 1A through 7B may be adapted to design needs of different microelectronic devices (e.g., different memory devices). By way of non-limiting example, in accordance with additional embodiments of the disclosure, FIGS. 9A through 15C show simplified partial top-down and cross-sectional views of a method of forming an apparatus including a device structure (e.g., a microelectronic device structure) having a different configuration than the device structure 100. Throughout the remaining description and the accompanying figures, functionally similar features (e.g., structures, devices) are referred to with similar reference numerals. To avoid repetition, not all features shown in the remaining figures (including FIGS. 9A through 15C) are described in detail herein. Rather, unless described otherwise below, a feature designated by a reference numeral of a previously-described feature (whether the previously-described feature is first described before the present paragraph, or is first described after the present paragraph) will be understood to be substantially similar to the previously-described feature.

Figure 9A:
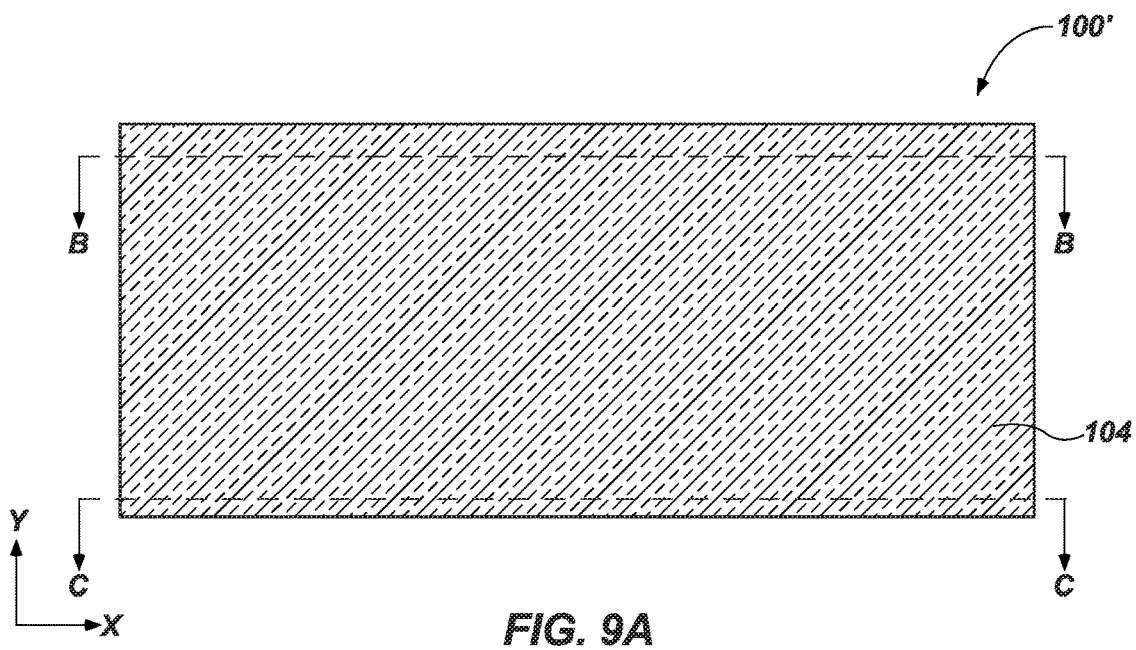
FIGS. 9A through 15C are simplified partial top-down (FIGS. 9A, 10A, 11A, 12A, 13A, 14A, and 15A) and simplified partial cross-sectional (FIGS. 9B, 9C, 10B, 10C, 11B, 11C, 12B, 12C, 13B, 13C, 14B, 14C, 15B, and 15C) views illustrating a method of forming another apparatus, in accordance with embodiments of the disclosure, where the cross-sectional views of FIGS. 9B, 10B, 11B, 12B, 13B, 14B, and 15B are taken along line B-B and the cross-sectional views of FIGS. 9C, 10C, 11C, 12C, 13C, 14C, and 15C are taken along line C-C, respectively, in FIGS. 9A, 10A, 11A, 12A, 13A, 14A, and 15A.
Figure 9B:
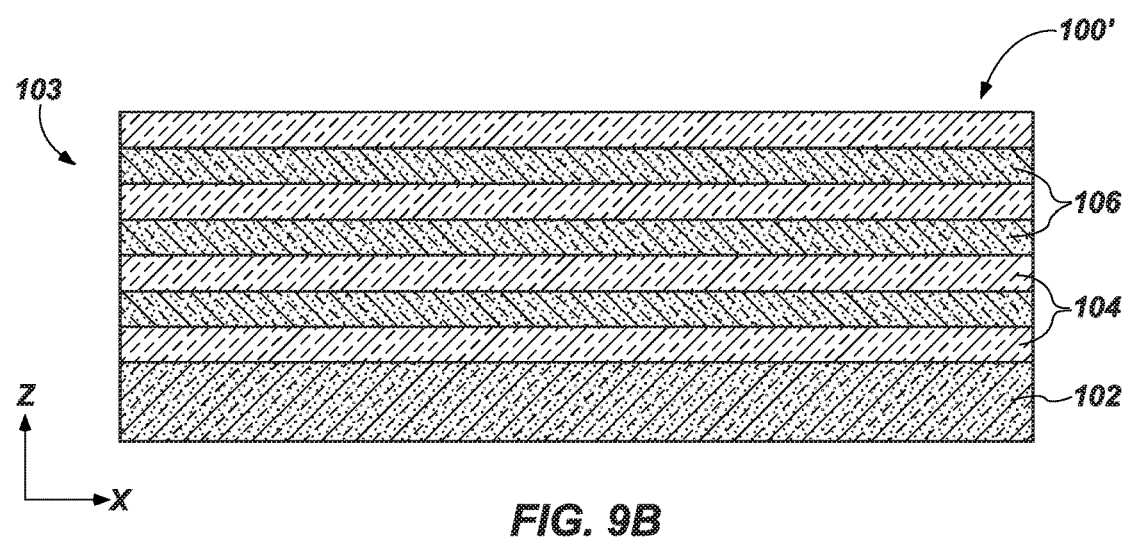
Figure 9C:
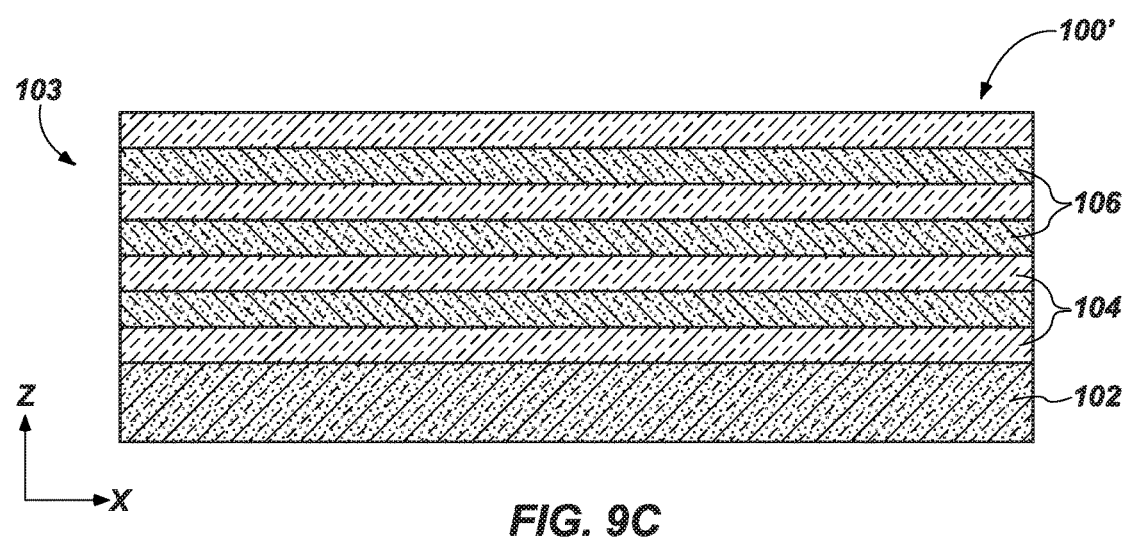

FIG. 9A is a simplified partial top-down view of a device structure 100'. At the processing stage depicted in FIG. 9A the device structure 100' may be substantially similar to the device structure 100 at the processing stage depicted in FIG. 1A. FIG. 9B shows a cross-sectional view of the device structure 100' through section line B-B of FIG. 9A, and FIG. 9C shows another cross-sectional view of the device structure 100' through section line C-C of FIG. 9A. Similar views are shown in FIGS. 10A through 15C, respectively, as discussed in greater detail below. The device structure 100' includes the stack 103 of alternating tiers of the electrically insulative material 104 and the conductive material 106 formed adjacent (e.g., on or over) the base material 102. Each of the base material 102, the electrically insulative material 104, and the conductive material 106 may include substantially the same materials as the materials described above with reference to FIGS. 1A and 1B.

Figure 10A:
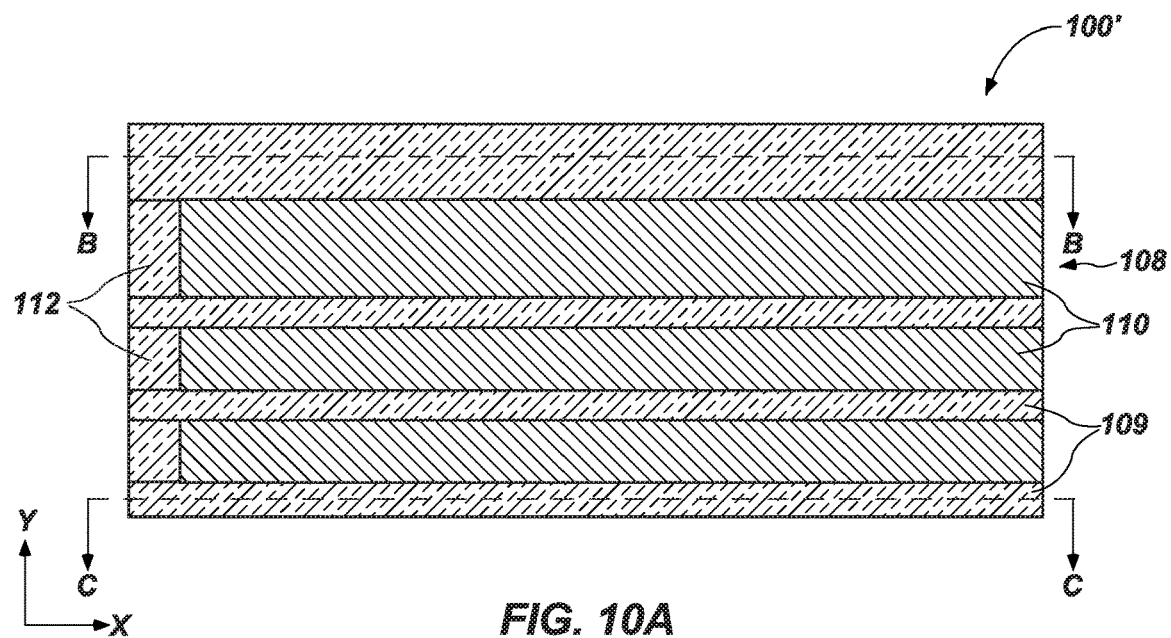
Figure 10B:
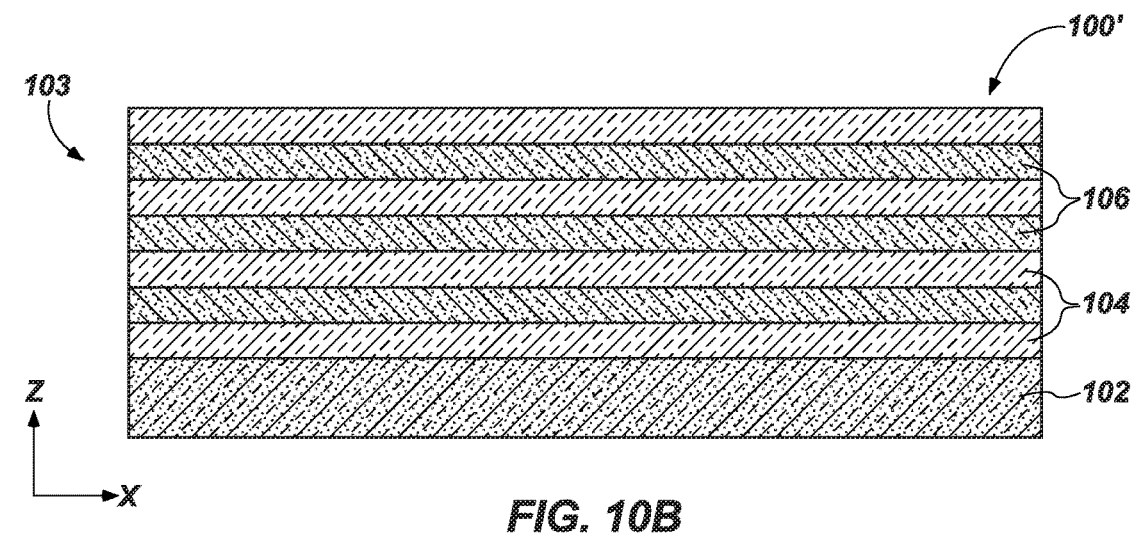
Figure 10C:
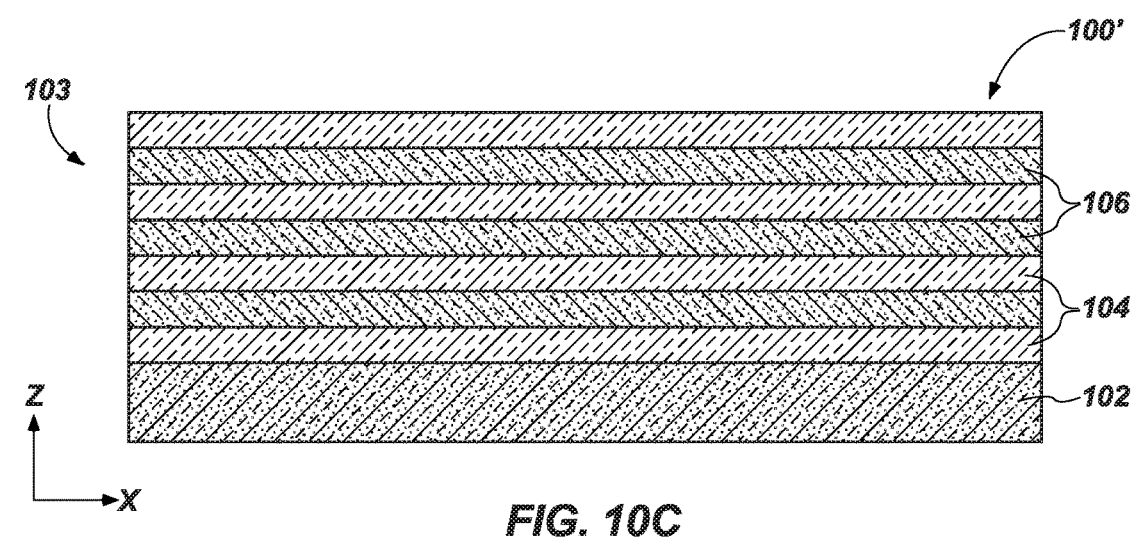

With reference to FIGS. 10A, 10B, and 10C, the electrically insulative material 110 may be disposed within the central openings 108 formed in the tiers of the alternating electrically insulative material 104 and the conductive material 106 and extending vertically between fin structures 109 (e.g., remaining portions of the electrically insulative material 104 and the conductive material 106 of the stack 103) substantially similar to the device structure 100 at the processing stage depicted in FIGS. 2A and 2B. The central openings 108 may be formed by conventional techniques. However, the device structure 100' of FIGS. 10A, 10B, and 10C may include multiple (e.g., three or more) fin structures 109 separated by multiple (e.g., two or more) portions of the electrically insulative material 110 disposed within the individual central openings 108, as shown in FIG. 10A. The electrically insulative material 110 may include substantially the same materials as the electrically insulative material 110 described above with reference to FIGS. 2A and 2B.

The device structure 100' includes the contact region 112 at a longitudinal end thereof. The contact region 112 may have a thickness (e.g., in the X-direction) that is substantially similar to the thickness $T_3$ of the contact region 112 of the device structure 100 (FIG. 3A) or, alternatively, the contact region 112 of the device structure 100' may have a thickness that is relatively less than the thickness $T_3$ of the contact region 112 of the previous embodiment. The thickness of the contact region 112 may or may not be substantially the same as a thickness of the support structures 116 and/or the fin structures 109. In some embodiments, one of the fin structures 109 may have a thickness that is relatively greater than the other of the fin structures 109. For example, the individual fin structure 109 along the section line B-B may exhibit a thickness that is relatively greater than the thickness of each of the other fin structures 109, as illustrated in FIG. 10A. However, the disclosure is not so limited, and another one (or more) of the fin structures 109 may exhibit an increased thickness relative to the other fin structures 109. In some embodiments, the device structure 100' exhibits an asymmetric configuration along a lateral dimension (e.g., extending in the Y-direction) thereof.

Figure 11A:
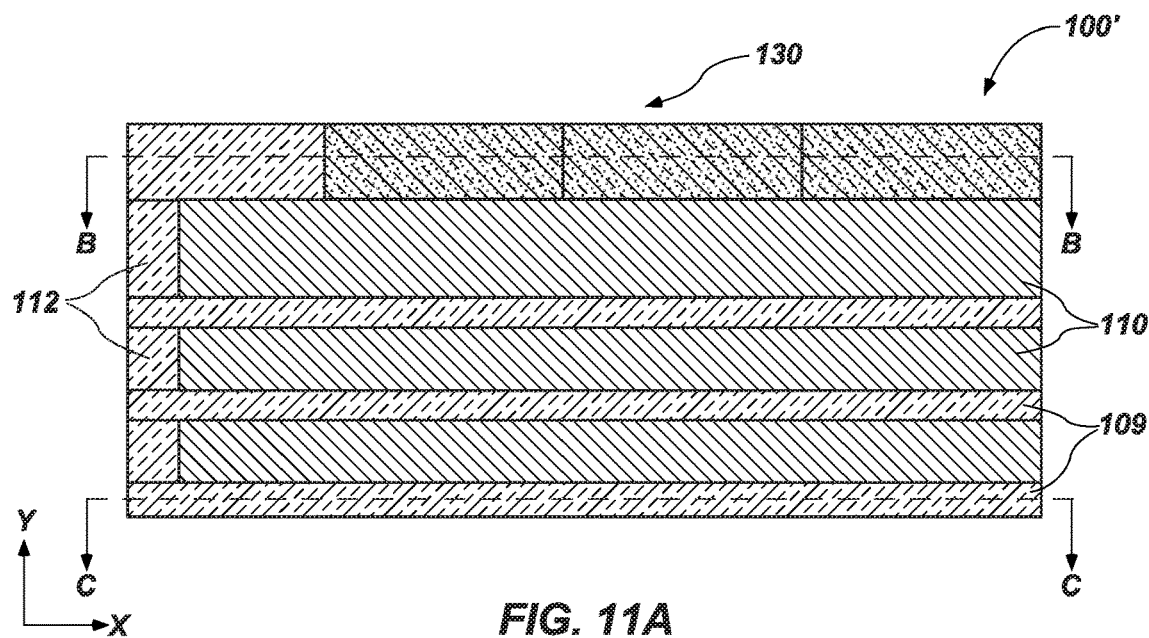
Figure 11B:
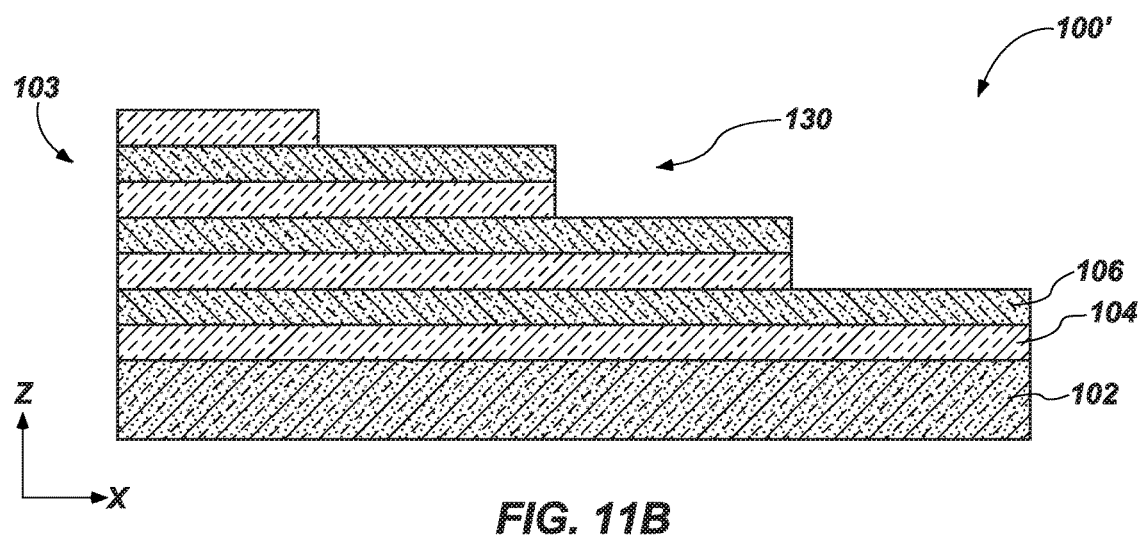
Figure 11C:
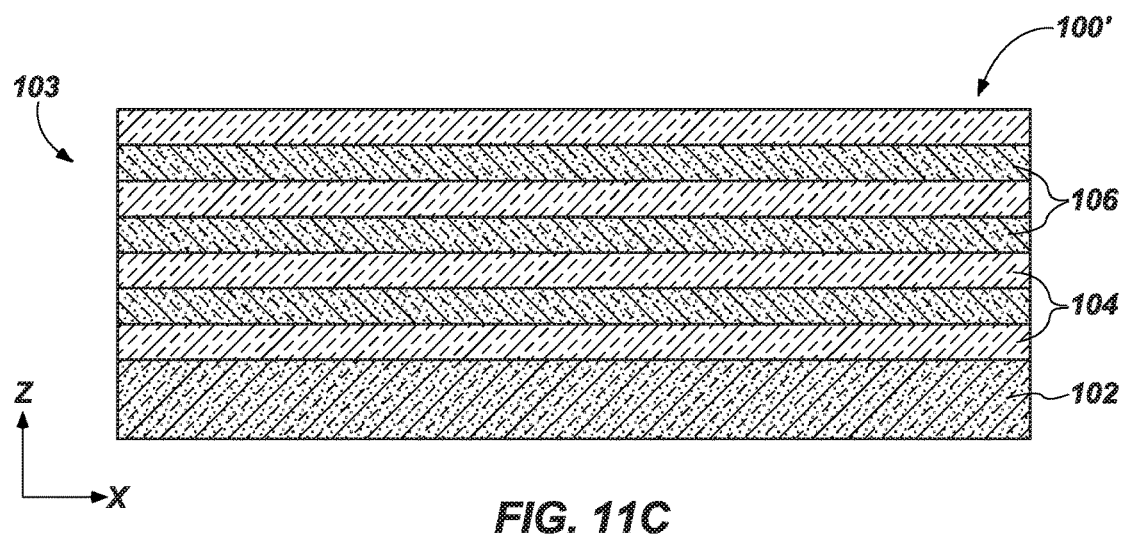

With reference to FIGS. 11A, 11B, and 11C, the staircase structure 130 may be formed at one or both (e.g., a single) lateral side of the device structure 100'. The staircase structure 130 may be formed by conventional techniques, as described above with reference to FIGS. 6A and 6B. However, the staircase structure 130 of the device structure 100' may be formed along the longitudinal extent thereof rather than being located within or proximate the contact region 112. Accordingly, the one or more individual fin structures 109 having the relatively greater thickness may be configured for formation of the staircase structure 130. The designated fin structures 109 is not configured to function as one of the fin structures 109 of subsequently formed devices (e.g., capacitor structures), as will be described herein. In some embodiments, individual stair step structures of the staircase structure 130 extend along the longitudinal length of the device structure 100' and substantially parallel to elongated portions of the fin structures 109, as shown in FIG.

11B, while the individual fin structure 109 along the section line C-C, does not include a staircase structure 130, as shown in FIG. 11C. The uppermost stair step structure of the staircase structure 130 may or may not include an uppermost portion of the electrically insulative material 104. In some embodiments, the uppermost stair step structure of the staircase structure 130 is proximate the contact region 112 and subsequent stair step structures thereof are formed to descend with increased distance from the contact region 112. However, the disclosure is not so limited, and additional configurations of the staircase structure 130 may be included. Accordingly, by forming the staircase structure 130 laterally adjacent (e.g., substantially parallel) to the elongated portions of the fin structures 109, such a configuration may allow improved density (e.g., improved packing efficiency) within the device structure 100'.

Following formation of the staircase structure 130, an insulative material (e.g., a sacrificial material, the electrically insulative material 140) (not shown) may be formed over portions of at least some of the stair step structures of the staircase structure 130. For example, the insulative material may be located adjacent (e.g., over) exposed upper surfaces of at least some of the stair step structures of the staircase structure 130 to protect the upper surfaces thereof and to provide a substantially uniform upper boundary (e.g., upper surface) of the device structure 100'. In some embodiments, upper surfaces of the insulative material may be planarized, such as by one or more CMP acts to facilitate or enhance the planarity of the upper surface thereof for further processing thereon. For clarity and ease of understanding the drawings and associated description, the insulative material (e.g., the electrically insulative material 140) is absent in FIGS. 11A through 14B.

Figure 12A:
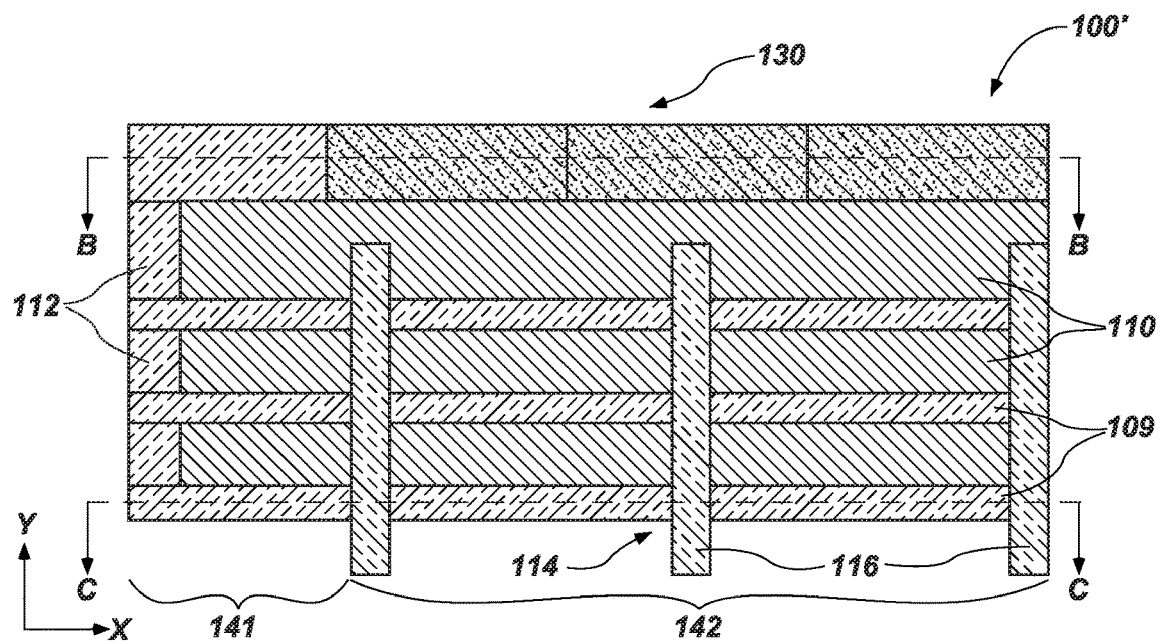
Figure 12B:
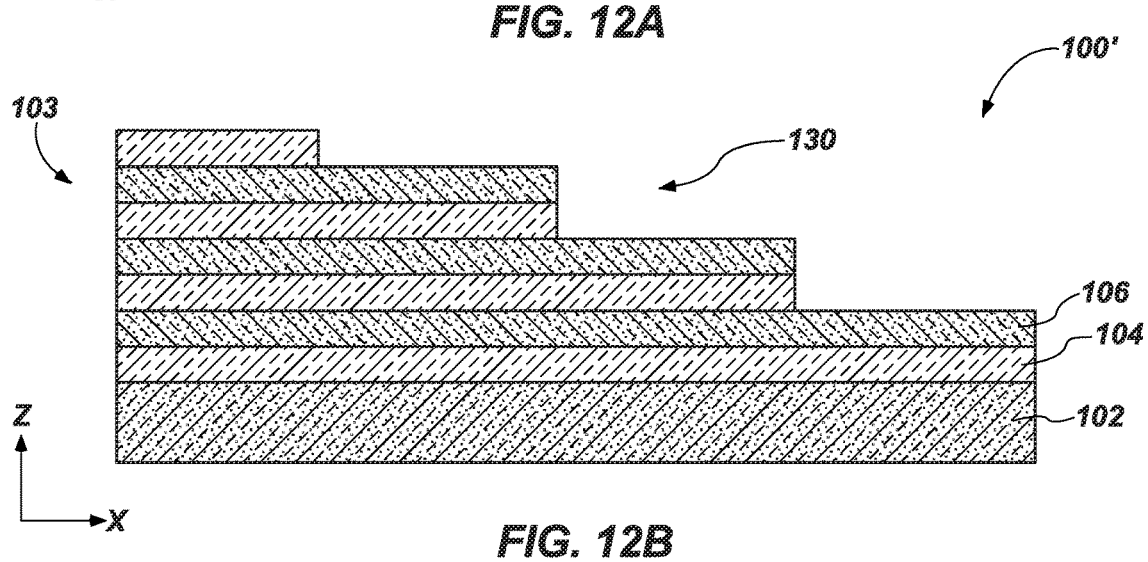
Figure 12C:
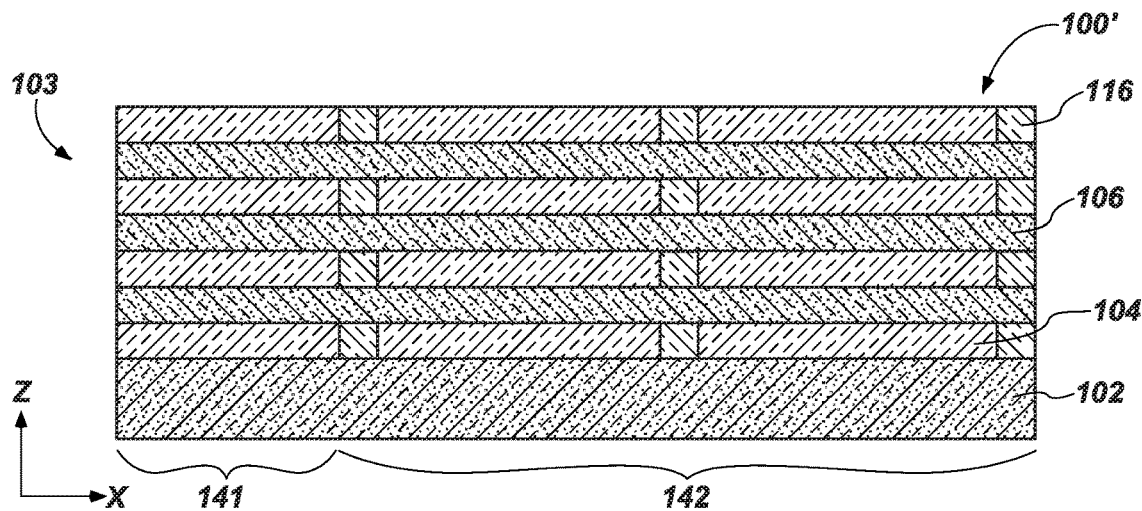

With reference to FIGS. 12A, 12B, and 12C, the support structures 116 of the device structure 100' may be disposed within the openings 114 extending in lines in the second direction (e.g., the Y-direction), as illustrated in FIG. 12A. In some embodiments, the support structures 116 extend (e.g., substantially fully extend) between upper surfaces of individual portions of the conductive material 106 and lower surfaces of vertically adjacent portions of the conductive material 106, as shown in FIG. 12C. In some embodiments, the support structures 116 extend proximate (e.g., in direct physical contact with) the staircase structure 130. In other embodiments, the support structures 116 do not fully extend to the staircase structure 130 such that end surfaces of the support structures 116 are embedded within the electrically insulative material 110 and spaces (e.g., gaps) are provided between the end surfaces of the support structures 116 and side surfaces of the staircase structure 130, as shown in FIG. 12A. The support structures 116 may include substantially the same materials as the materials described above and may be formed as described above. The support structures 116 may define a first region 141 and a second region 142 of the stack 103, as discussed in greater detail with reference to FIGS. 3A and 3B.

Figure 13A:
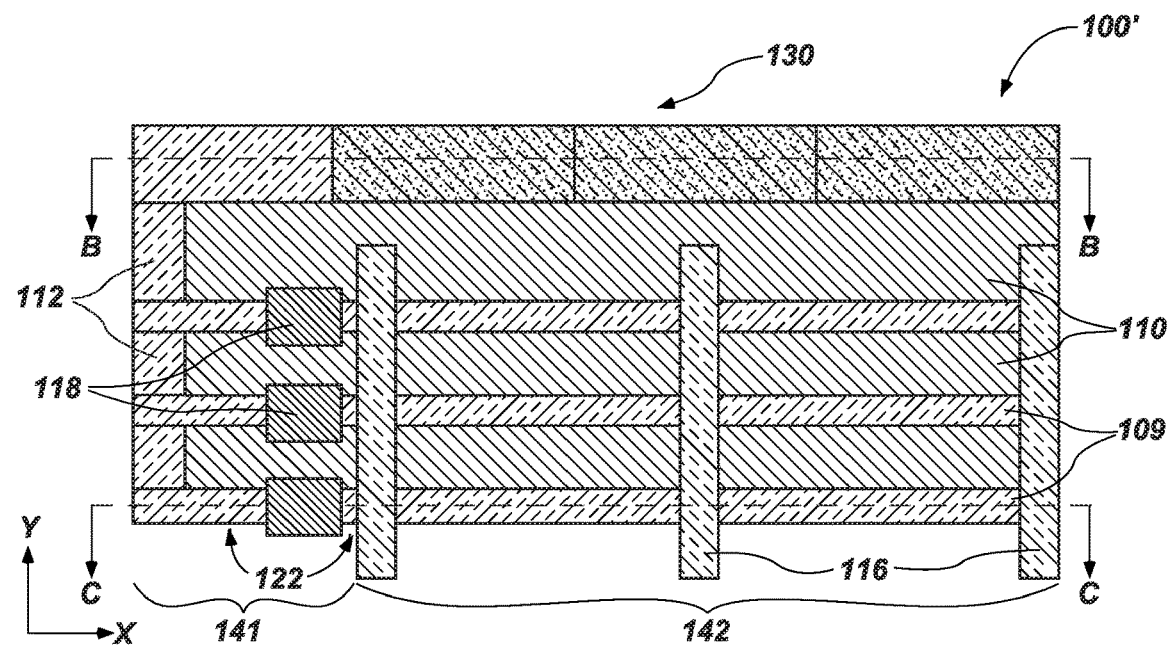
Figure 13B:
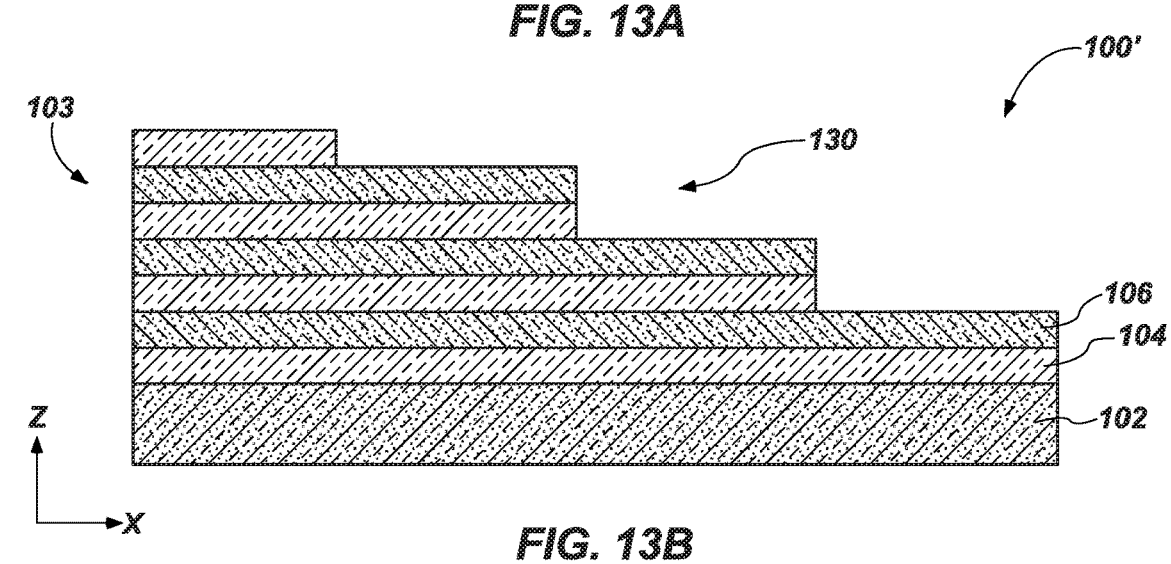
Figure 13C:
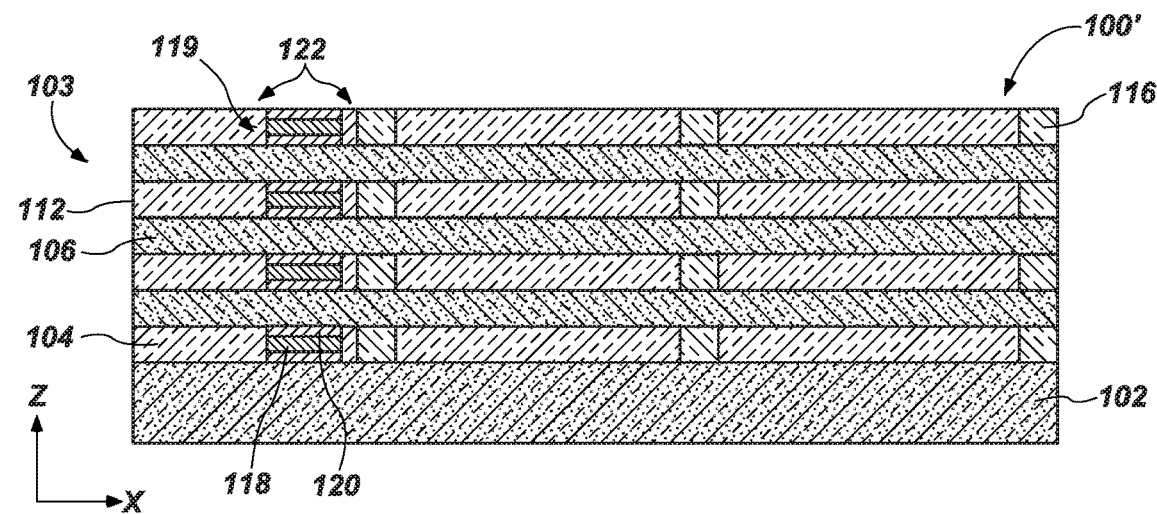

With reference to FIGS. 13A, 13B, and 13C, the gate electrodes 118 may be formed on the fin structures 109. In some embodiments, a single gate electrode 118 is formed on individual fin structures 109 lacking the staircase structure 130. The gate electrodes 118 may be surrounded on at least some sides thereof by the gate dielectric material 120. The gate dielectric material 120 may be formed adjacent to (e.g., above, below) individual portions of the conductive material 106 and may be formed prior to formation of the gate electrodes 118. Each of the gate electrodes 118 and the gate dielectric material 120 may include substantially the same materials as the materials described above with reference to FIGS. 4A and 4B and may be formed as described above. The gate electrodes 118 may be configured as a portion of a wordline extending in a third direction (e.g., the Z-direction) and the access devices 119 (FIG. 16) may include material of the conductive material 106 adjacent to the gate electrodes 118. The gate electrodes 118 and, thus, the access devices 119 may or may not be isolated (e.g., physically isolated) from the support structures 116 and/or the contact region 112 by the isolation regions 122.

Figure 14A:
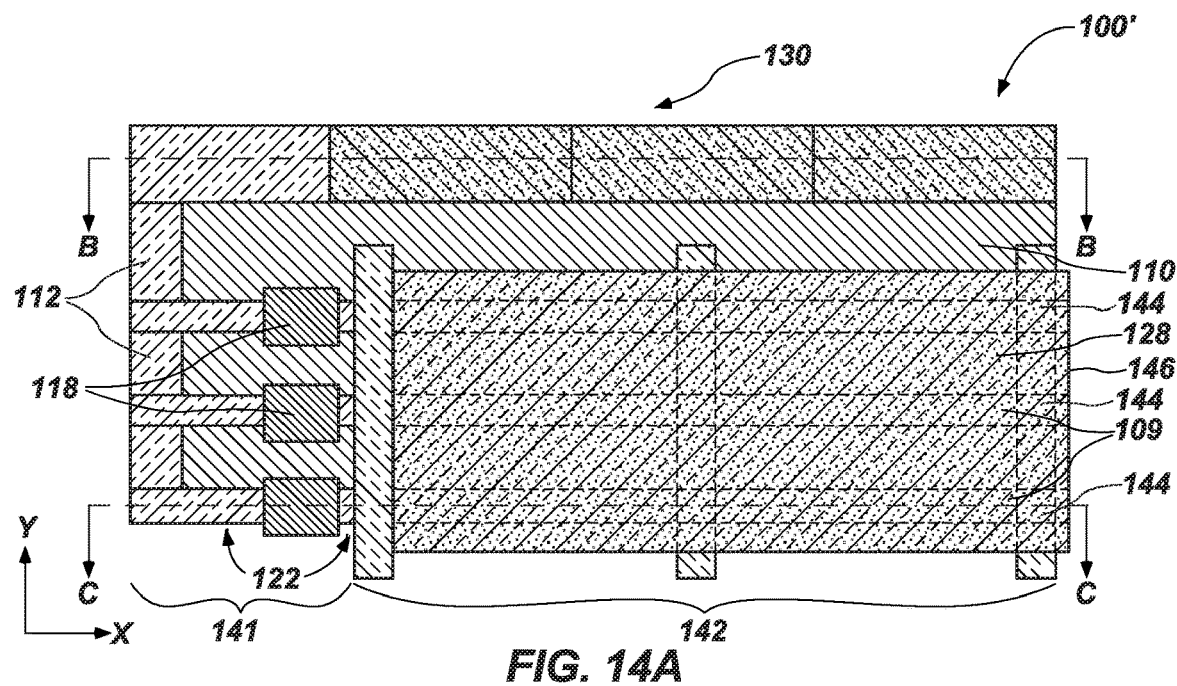
Figure 14B:
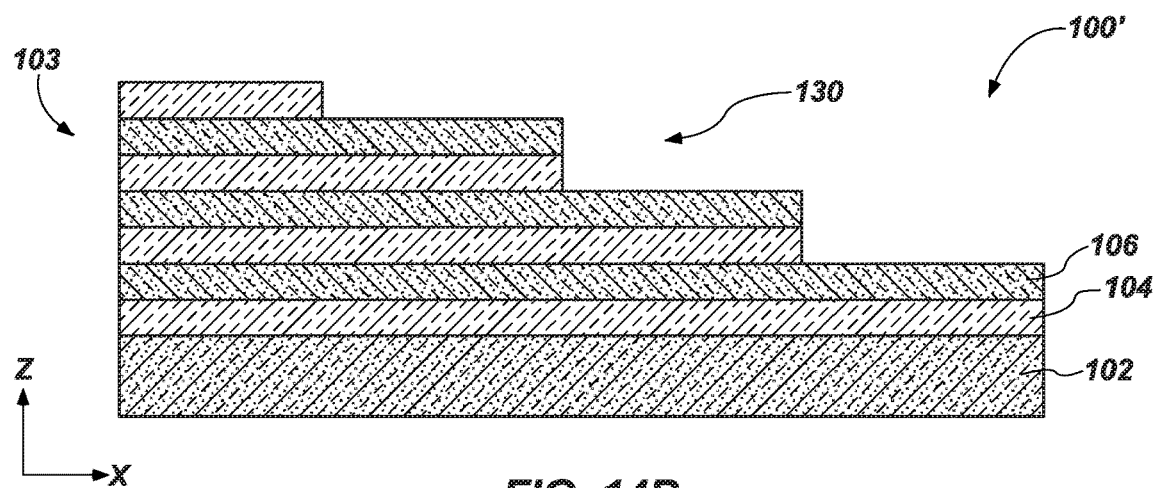
Figure 14C:
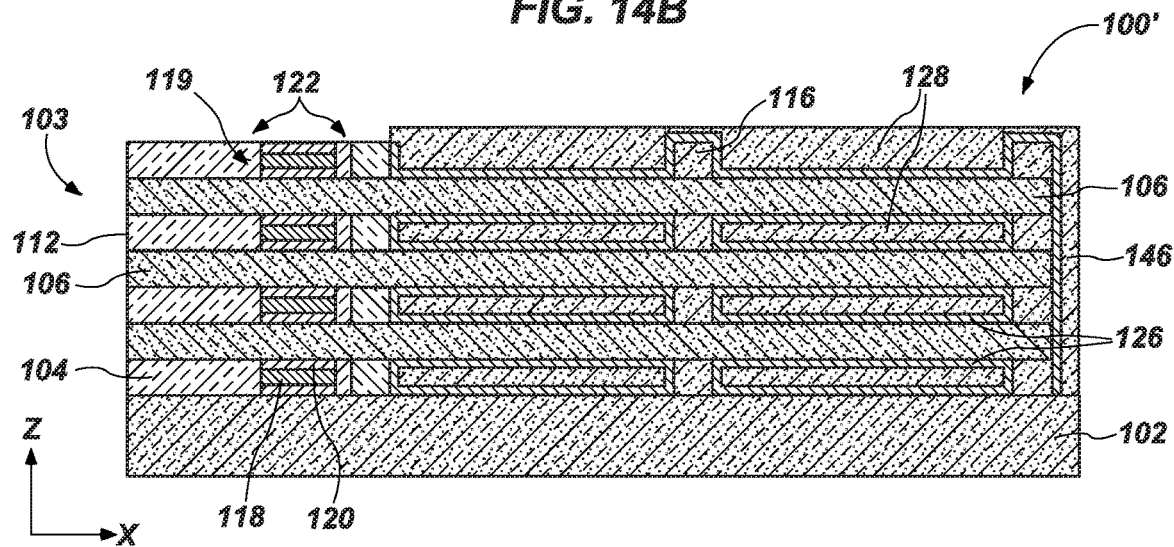

With reference to FIGS. 14A, 14B, and 14C, the capacitor dielectric material 126 of the device structure 100' may be disposed within the openings 124 adjacent to (e.g., overlying, underlying) the conductive material 106 of the fin structures 109. The conductive material 128 may be formed adjacent to and in contact (e.g., direct physical contact) with the capacitor dielectric material 126 within the openings 124 in the second region 142. In some embodiments, portions of the capacitor dielectric material 126 and/or the conductive material 128 are formed in the end region 146. Each of the capacitor dielectric material 126 and the conductive material 128 may be formed using substantially similar processes and may include substantially the same materials as the materials described above with reference to FIGS. 5A and 5B. Formation of the capacitor dielectric material 126 and conductive material 128 results in formation of the stacked horizontal capacitor structures 144.

Figure 15A:
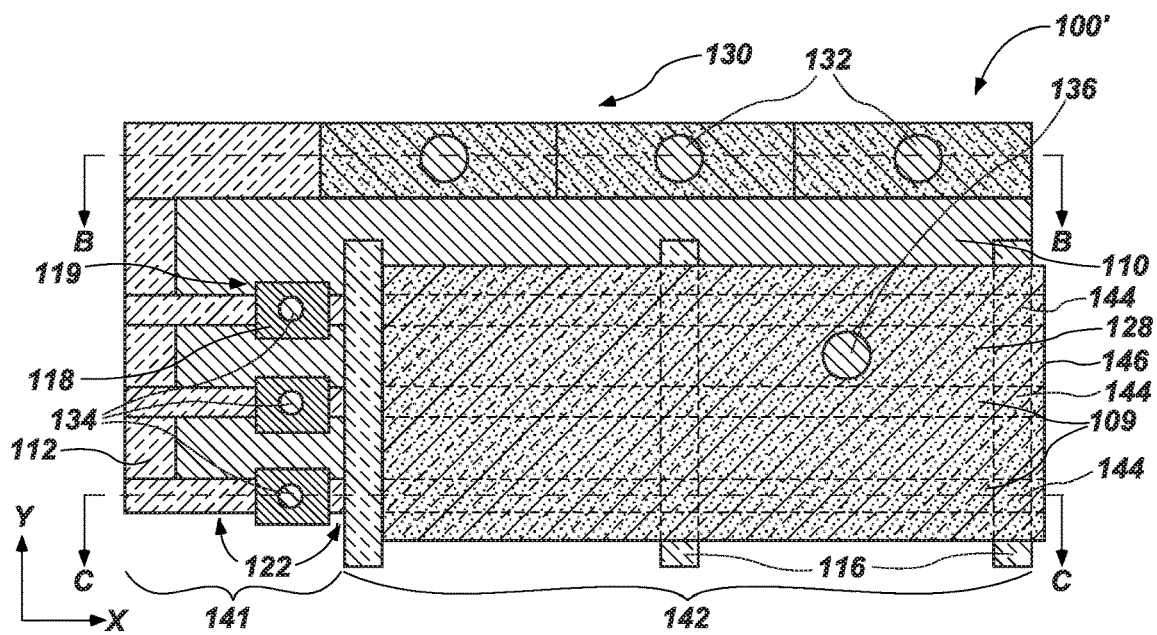
Figure 15B:
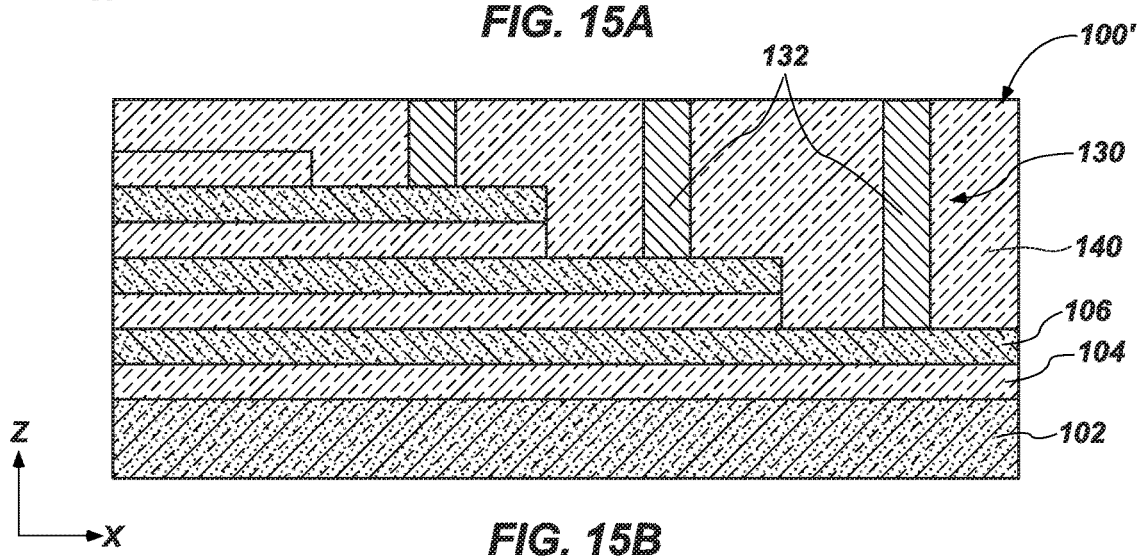
Figure 15C:
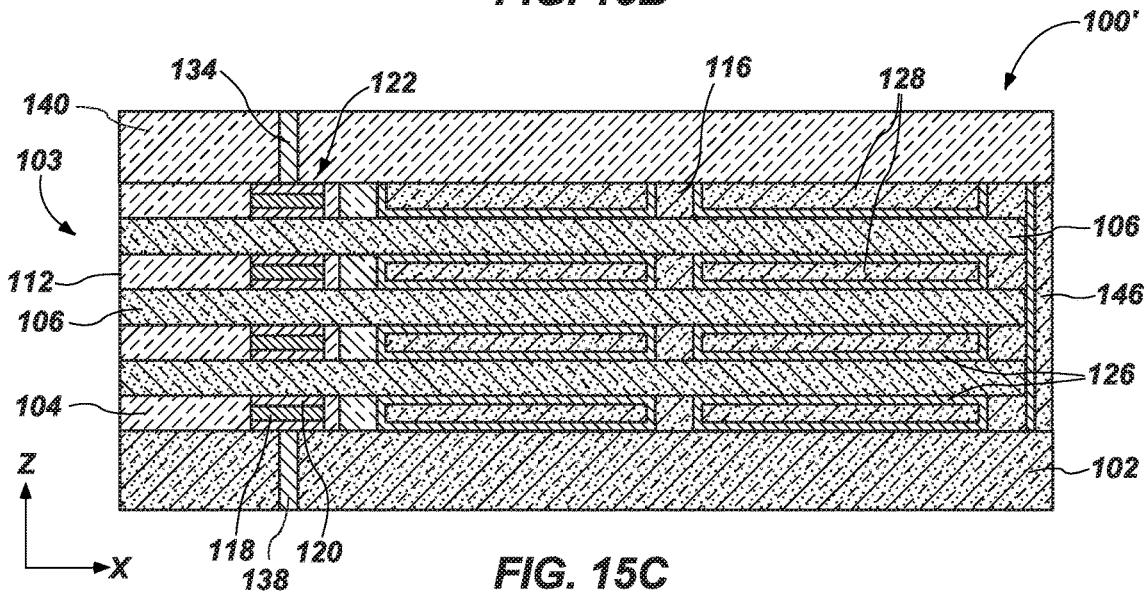

With reference to FIGS. 15A, 15B, and 15C, the electrically insulative material 140 may be disposed over the device structure 100', as shown in FIGS. 15B and 15C. For clarity and ease of understanding the drawings and associated description, the electrically insulative material 140 is absent in FIG. 15A. The conductive contacts 132, the conductive contacts 134, and the upper conductive contacts 136 may be formed in openings of the electrically insulative material 140 to physically and electrically contact the respective conductive materials, as discussed in greater detail with reference to FIGS. 7A and 7B. The lower conductive contact 138 may, optionally, be formed within the base material 102 and extend between a lower portion of the gate electrodes 118 and other conductive elements (not shown) underlying the base material 102. For example, the device structure 100' may overlie a complementary metal oxide semiconductor (CMOS) region, such as CMOS under array (CUA) region, as described in greater detail with reference to FIG. 18. The individual capacitor structures 144 include the individual conductive materials 106 of the multiple (e.g., three or more) fin structures 109. In some embodiments, the conductive contacts 132 are centrally located on individual stair step structures of the staircase structure 130. However, the disclosure is not so limited and the conductive contacts 132 may be arranged in a configuration different than that illustrated in FIG. 15A. Each of the electrically insulative material 140 and the contacts (e.g., the conductive contacts 132, the conductive contacts 134, the upper conductive contacts 136, and the lower conductive contact 138) may include substantially the same materials as the materials described above with reference to FIGS. 7A and 7B.

Figure 16:
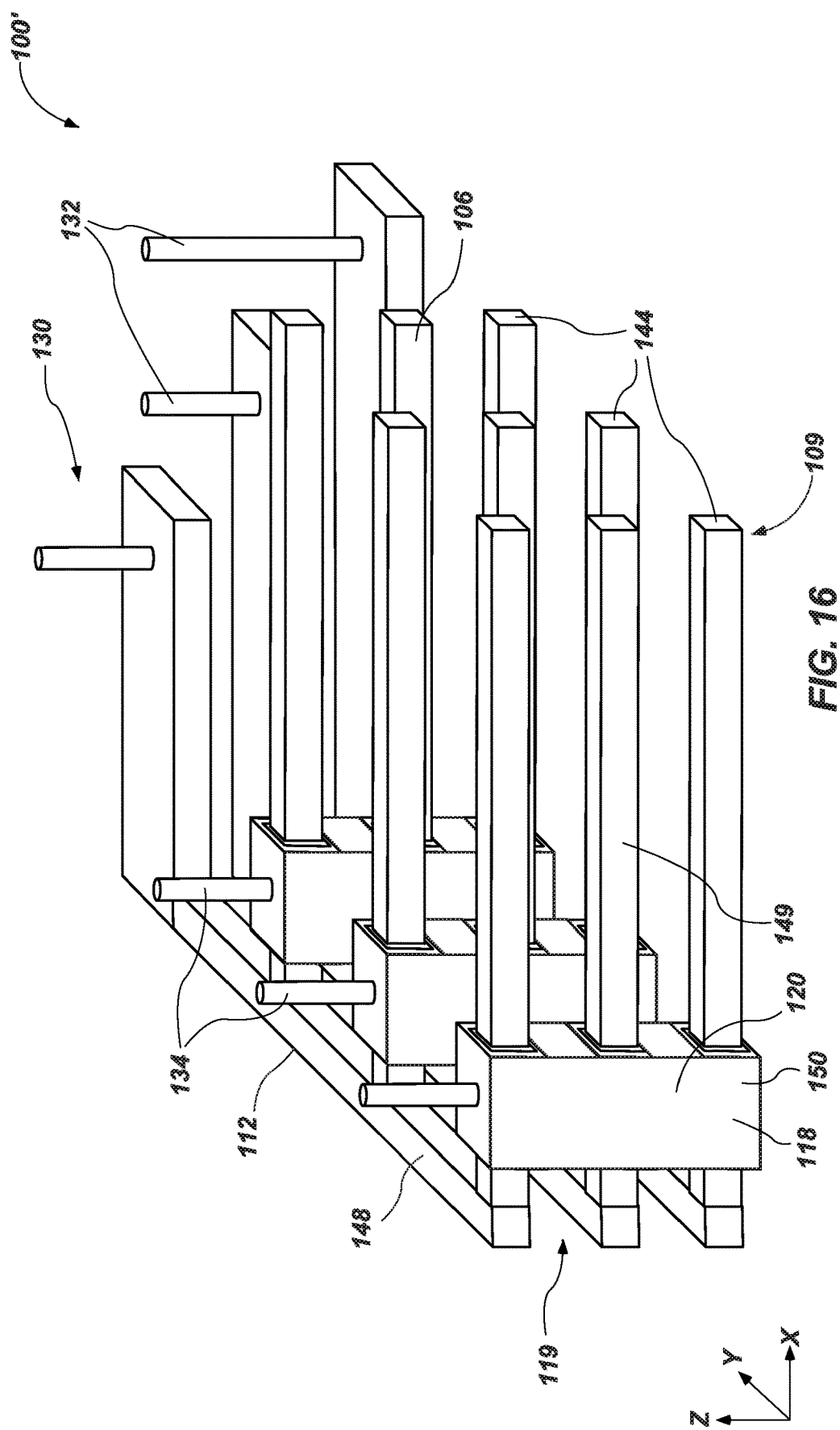
FIG. 16 is a simplified perspective view of the apparatus of FIGS. 9A through 15C, in accordance with embodiments of the disclosure.

FIG. 16 is a simplified perspective view of the apparatus including the device structure 100' of FIGS. 9A through 15C. For clarity and ease of understanding the drawings and associated description, materials including the base material 102, the electrically insulative material 104, the electrically insulative material 110, the electrically insulative material 140, the support structures 116, the capacitor dielectric material 126, and the conductive material 128 are absent from FIG. 16. The conductive materials 106 in the second region 142 form the individual capacitor structures 144 that are aligned horizontally and stacked vertically within the device structure 100', as discussed in greater detail above with reference to FIG. 8. In the embodiment of FIG. 16, however, the capacitor structures 144 include multiple (e.g., three or more) fin structures 109 having elongated portions extending in a first direction (e.g., the X-direction) with the contact region 112 connecting the fin structures 109 and extending therebetween in a second direction (e.g., the Y-direction). The capacitor structures 144 of may be connected with one another by the contact region 112 to exhibit multiple U-shaped configurations thereof. In some embodiments, the contact regions 112 may be configured as the first conductive lines 148 extending in the second direction. Additional laterally adjacent capacitor structures 144 may extend continuously on either (e.g., each) lateral side thereof. Multiple levels (e.g., three levels shown for clarity) may be stacked in a third direction (e.g., the Z-direction), as illustrated in FIG. 16.

The conductive material 106 of the fin structures 109 may be configured as the junctionless nanowires 149 extending in the first direction, and the access devices 119 may also include the conductive material 106 of the fin structures 109. Thus, the access devices 119 may be formed of the same material of the capacitor structures 144 (e.g., of the same junctionless nanowires 149) forming the individual levels of the fin structures 109, as discussed in greater detail above with reference to FIG. 8. The access devices 119 may be formed proximate intersections of the first conductive lines 148 and the second conductive lines 150. The gate electrodes 118 surrounding the individual conductive materials 106 may be connected by the second conductive lines 150 (e.g., access lines, wordlines) extending in the third direction (e.g., the Z-direction) that is substantially transverse (e.g., substantially perpendicular) to the second direction (e.g., the Y-direction) of the first conductive lines 148. The second conductive lines 150 extend in a direction that is substantially transverse to a major plane of the base material 102 (FIG. 15C), as described in greater detail with reference to FIG. 8. Accordingly, the capacitor structures 144 aligned in a single vertical column share a common line (e.g., a common access line) of the second conductive lines 150. Each of the one or more (e.g., three) second conductive lines 150 and corresponding gate electrodes 118 of the individual conductive materials 106 of the fin structures 109 may be connected by one or more (e.g., a single) conductive contact 134. The individual capacitor structures 144 and respective access devices 119 of individual conductive materials 106 share a common gate electrode 118.

With continued reference to FIG. 16, the support structures 116 (see FIG. 15C) may provide structural stability within the device structure 100' along a longitudinal extent thereof. The support structures 116 may optionally be present in the device structure 100' depending on the length of the fin structures 109. The staircase structure 130 formed at one or both (e.g., a single) lateral side of the device structure 100' may also provide structural stability while facilitating a smaller footprint therein. Additionally, the lateral configuration of the staircase structure 130 may allow for improved configurations (e.g., decreased distances) between connections of the conductive materials, both within and external to the device structure 100'. For example, the individual stair step structures of the staircase structure 130 provide lateral step-wise electrical access to the conductive contacts 132 corresponding to each of the capacitor structures 144. The configuration of the staircase structure 130 of the device structure 100' allows for contact formation to each level of conductive material 106 forming the individual first conductive lines 148 extending in the second direction. Accordingly, the capacitor structures 144 on individual conductive materials 106 of the fin structures 109 share a common line (e.g., a common data line) of the first conductive lines 148. Each of the first conductive lines 148 may be connected by one or more (e.g., a single) common conductive contacts 132. Advantages of the configuration of the device structure 100' of FIG. 16 are similar to those of the device structure 100 of FIG. 8, as discussed in greater detail above. Such advantages may include, for example, improved density as devices are scaled down in size, reduced power consumption during use and operation, and improved electrical isolation between adjacent capacitor structures 144 to reduce occurrences of bridging between adjacent capacitor structures 144 during fabrication as well as reduce leakage during use and operation. Further advantages may include increased efficiency by providing simplified process flows, reduced manufacturing costs during fabrication, and improved reliability during use and operation of the apparatus.

Figure 17:
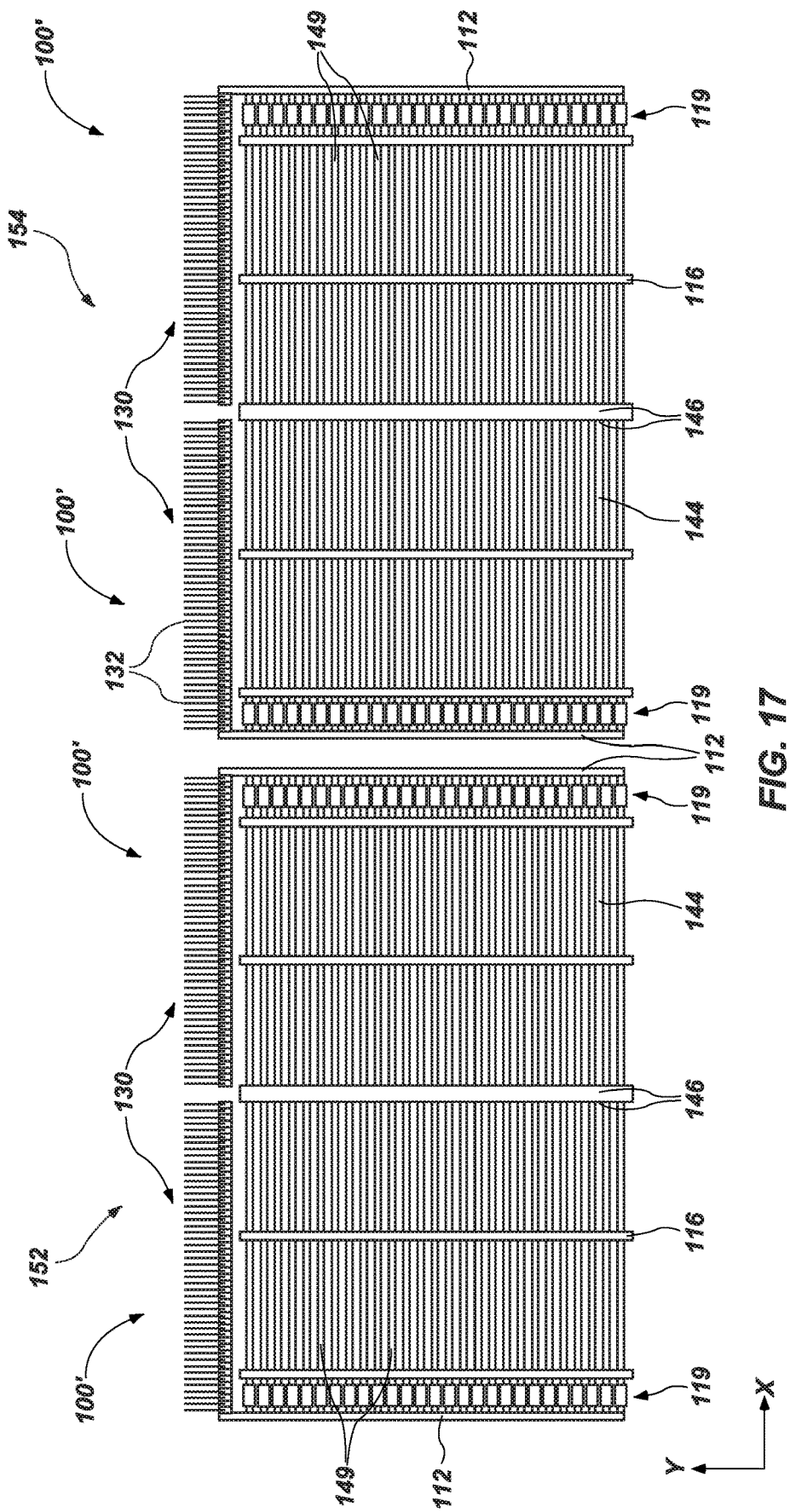
FIG. 17 is a simplified partial top-down view of the apparatus of FIGS. 9A through 15C, in accordance with embodiments of the disclosure.

FIG. 17 is a simplified partial top-down view of the apparatus of FIGS. 9A through 15C. The method of forming the apparatus including the device structure 100' may include simultaneously forming multiple (e.g., more than one, an array of) device structures 100'. For example, multiple (e.g., two) of the device structures 100' may be formed adjacent (e.g., immediately adjacent) one another to form a first array 152 and multiple (e.g., two) additional device structures 100' may be formed adjacent one another to form a second array 154. Additional laterally adjacent arrays may be formed in each of the first direction (e.g., the X-direction) and the second direction (e.g., the Y-direction), and additional vertically adjacent arrays may be formed in the third direction (e.g., the Z-direction).

Two of the device structures 100' of a single array 152, 154 may be oriented such that the contact region 112 of a first device structure 100' is located distal from the contact region 112 of a second device structure 100'. Accordingly, the end regions 146 of each of the two device structures 100' may be proximal (e.g., immediately adjacent) one another in a so-called "tip-to-tip" configuration, as shown in FIG. 17. In some embodiments, the support structures 116 of the adjacent end regions 146 of the two device structures 100' are adjacent (e.g., in direct physical contact with) one another without intervening materials. In some such embodiments, the two centermost support structures 116 are substantially continuous with one another. In other embodiments, the support structures 116 of the adjacent end regions 146 of the two device structures 100' are proximal one another without being in direct physical contact with one another (e.g., with one or more materials intervening therebetween). The proximal portions of the contact regions 112 of the first array 152 and the second array 154 may or may not be immediately adjacent one another. As shown in FIG. 17, the device structures 100' of the first array 152 and the second array 154 having the staircase structures 130 formed at one or both (e.g., a single) lateral side thereof may allow for improved configurations (e.g., decreased distances) between the conductive contacts 132 and additional connections (not shown) external to the device structures 100'.

Figure 18:
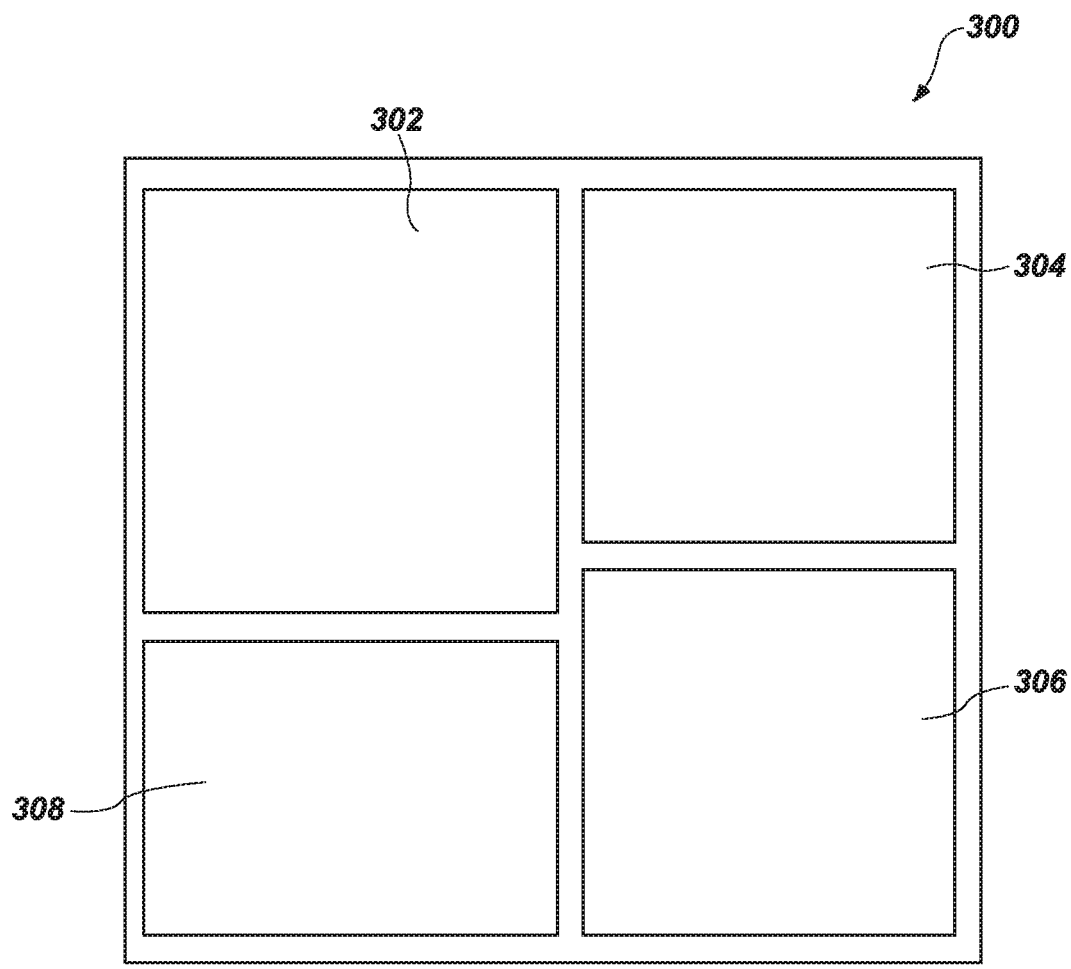
FIG. 18 is a schematic block diagram illustrating a microelectronic device, in accordance with embodiments of the disclosure.

Apparatuses including one or more of the device structures 100, 100' such as those shown in FIGS. 1A through 8 and 9A through 17 may be used in embodiments of microelectronic devices of the present disclosure. FIG. 18 is a block diagram of an illustrative microelectronic device 300 (e.g., a 3D DRAM device) according to an embodiment of the present disclosure. The microelectronic device 300 may include at least one memory cell array 302 such as, for example, a plurality of memory arrays. The microelectronic device 300 may further include at least one peripheral circuit 304 that inputs data from outside the microelectronic device 300, thus providing access to the at least one memory cell array 302. The microelectronic device 300 may further include a charge pump circuit 306 for generating an input voltage. The peripheral circuit 304 and the charge pump circuit 306 may include one or more capacitors, such as the embodiments of the capacitor structures 144 of the device structures 100, 100' shown in FIGS. 1A through 8 and 9A through 17. The peripheral circuit 304 and charge pump circuit 306 may communicate electrically with the at least one memory cell array 302 by way of the capacitor structures 144. For example, the microelectronic device 300 may include the memory cell arrays 302, which may include a complementary metal-oxide-semiconductor (CMOS) region, such as CMOS under array (CUA) region 308 underlying the memory cell arrays 302. The memory cell arrays 302 may include memory cells that are connected to access lines (e.g., word lines) and data lines (e.g., bit lines). Further, the CUA region 308 may underlie the memory cell arrays 302 and include support circuitry thereof. The support circuitry may support one or more additional arrays of memory cells present in a stacked configuration. For example, the microelectronic device 300, including the memory cell array 302 having memory cells, can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells. In a stacked configuration, the CUA region 308 may facilitate accessing one or more memory cells in each array. For example, the CUA region 308 may facilitate the transfer of data between a memory cell coupled to a channel of a memory cell array 302, a memory cell coupled to a channel of an additional memory cell array 302 that is coupled to memory cell array 302, and a controller.

Accordingly, a memory device comprising at least one array of memory cells is disclosed. The at least one array of memory cells comprises data lines extending in a horizontal direction, and access lines extending in a vertical direction, substantially transverse to the horizontal direction. The at least one array of memory cells comprises capacitor structures aligned horizontally in the first horizontal direction and stacked vertically in the vertical direction, and access devices electrically coupled to the access lines. The access devices comprise a conductive material common to the capacitor structures.

Figure 19:
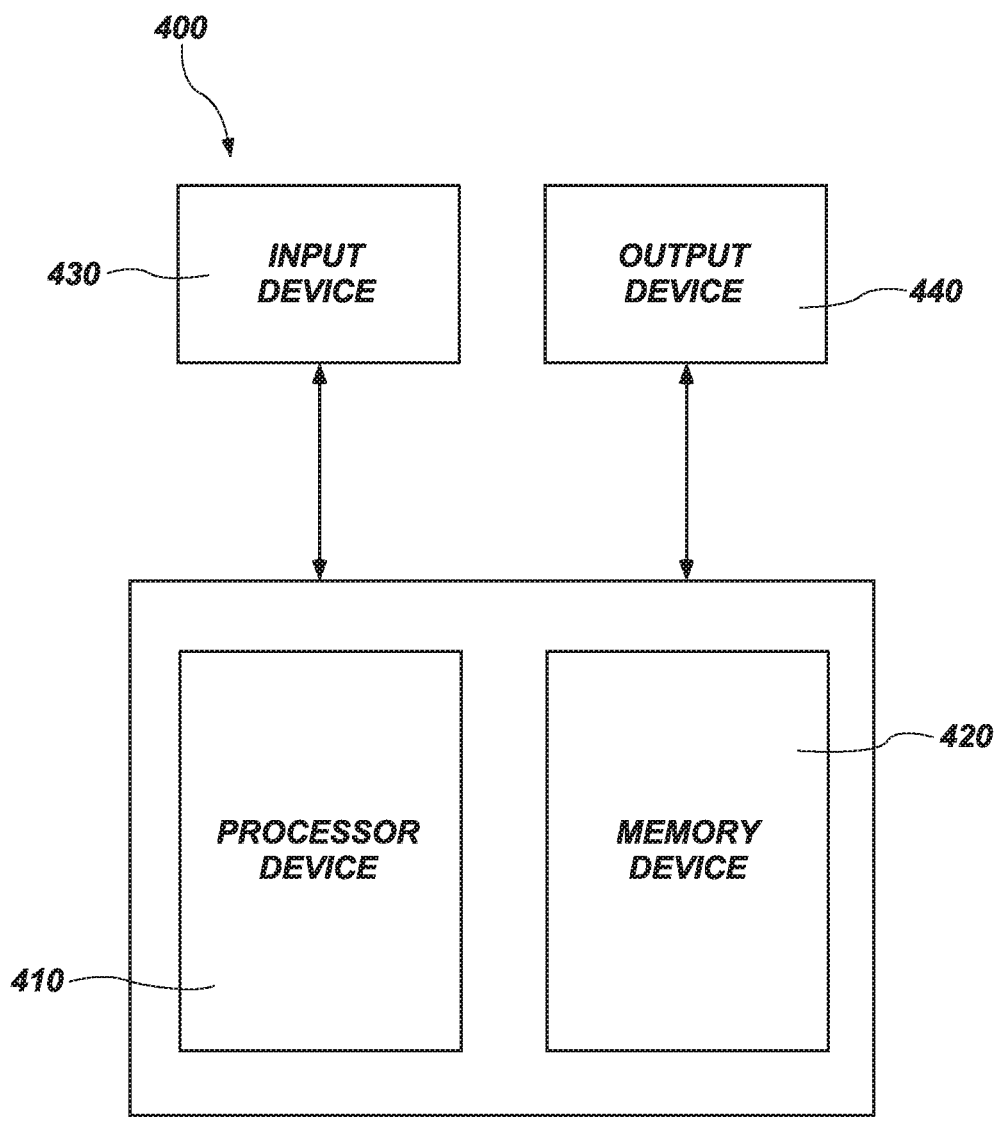
FIG. 19 is a schematic block diagram illustrating an electronic system, in accordance with embodiments of the disclosure.

The device structures (e.g., the device structures 100, 100') in accordance with embodiments of the disclosure may be used in embodiments of electronic systems of the disclosure. For example, FIG. 19 is a block diagram of an illustrative electronic system 400 according to embodiments of the disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 400 includes at least one memory device 420. The memory device 420 may include, for example, an embodiment of a microelectronic device previously described herein (e.g., device structures 100, 100') previously described herein. The electronic system 400 may further include at least one electronic signal processor device 410 (often referred to as a "microprocessor"). The electronic signal processor device 410 may, optionally, include an embodiment of a microelectronic device previously described herein (e.g., the device structures 100, 100'). The electronic system 400 may further include one or more input devices 430 for inputting information into the electronic system 400 by a user, such as, for example, a mouse or other pointing device, a keyboard, a touchpad, a button, or a control panel. The electronic system 400 may further include one or more output devices 440 for outputting information (e.g., visual or audio output) to a user such as, for example, a monitor, a display, a printer, an audio output jack, a speaker, etc. In some embodiments, the input device 430 and the output device 440 may comprise a single touchscreen device that can be used both to input information to the electronic system 400 and to output visual information to a user. The input device 430 and the output device 440 may communicate electrically with one or more of the memory device 420 and the electronic signal processor device 410.

Thus, in accordance with embodiments of the disclosure, an electronic system comprises at least one input device, at least one output device, at least one processor device operably coupled to the at least one input device and the at least one output device, and a memory device operably coupled to the at least one processor device. The memory device comprises capacitor structures each comprising a first electrode and a second electrode separated from one another by a dielectric material. The first electrode includes elongated portions of a conductive material extending in a horizontal direction. Opposing portions of the first electrode connected with one another by a contact portion extending therebetween. The memory device further comprises gate structures located proximate the contact portion with a single gate structure coupled to each of the opposing portions of the first electrode and conductive lines extending in a vertical direction transverse to the horizontal direction. The conductive lines connect individual gate structures of respective capacitor structures stacked in the vertical direction.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus, comprising:
   fin structures comprising individual levels of a conductive material comprising elongated portions extending in a first horizontal direction;
   first conductive lines extending in a second horizontal direction transverse to the first horizontal direction, at least portions of the first conductive lines aligned vertically;
   second conductive lines extending in a vertical direction transverse to each of the first horizontal direction and the second horizontal direction;
   horizontal capacitor structures comprising the conductive material of the fin structures; and access devices proximate intersections of the first conductive lines and the second conductive lines, the access devices comprising the conductive material of the fin structures.

2. The apparatus of claim 1, further comprising support structures extending in the second horizontal direction, the support structures comprising an electrically insulative material located between vertically neighboring portions of the individual levels of the conductive material of the fin structures.

3. The apparatus of claim 1, wherein individual access devices comprise gate structures at least partially surrounding a gate dielectric material, at least some of the gate structures substantially surrounding the conductive material of the fin structures.

4. The apparatus of claim 3, wherein individual horizontal capacitor structures and respective access devices share a common gate structure.

5. The apparatus of claim 1, wherein the first conductive lines are configured as data lines, the horizontal capacitor structures on the individual levels of the conductive material of the fin structures sharing a common data line.

6. The apparatus of claim 1, wherein the second conductive lines comprise access lines, the horizontal capacitor structures aligned in a single vertical column sharing a common access line.

7. The apparatus of claim 1, further comprising:
a staircase structure adjacent to at least one of a longitudinal end or a lateral side of the elongated portions of the conductive material of the fin structures; and
conductive contacts on respective stairs of the staircase structure, each of the first conductive lines on a respective level sharing common conductive contacts.

8. The apparatus of claim 1, wherein adjacent portions of the conductive material of adjacent fin structures are electrically connected with one another in a contact region proximate a longitudinal end of the fin structures.

9. The apparatus of claim 1, further comprising a base material underlying the horizontal capacitor structures, wherein the elongated portions of the conductive material of the fin structures extend substantially parallel to a major plane of the base material and elongated portions of the second conductive lines extend substantially transverse to the major plane of the base material.

10. A method of forming an apparatus, comprising:
forming at least one opening vertically extending through a stack of alternating conductive materials and dielectric materials overlying a base material, remaining portions of the alternating conductive materials and dielectric materials of the stack defining fin structures extending in a first horizontal direction;
forming at least one gate structure adjacent the conductive materials of the fin structures;
forming horizontal capacitor structures adjacent to individual levels of the conductive materials of the fin structures;
forming at least one staircase structure comprising materials of the stack of alternating conductive materials and dielectric materials;
forming an electrically insulative material overlying at least portions of the stack; and
forming conductive contacts through openings in the electrically insulative material.

11. The method of claim 10, further comprising:
forming first conductive lines including the conductive materials of the stack; and
forming second conductive lines including material of the at least one gate structure, the second conductive lines extending in a vertical direction transverse to each of the first horizontal direction of the fin structures and a major plane of the base material.

12. The method of claim 10, further comprising:
forming the conductive materials of the fin structures as junctionless nanowires comprising a conductively doped semiconductor material comprising one of a p-type dopant or an n-type dopant, without comprising the other of the p-type dopant or the n-type dopant; and
forming access devices including a portion of the conductively doped semiconductor material of the junctionless nanowires.

13. The method of claim 10, wherein forming the at least one staircase structure comprises forming a single staircase structure proximate to a lateral side surface of the horizontal capacitor structures and extending substantially parallel to elongated portions of the fin structures.

14. The method of claim 10, wherein:
forming the at least one opening comprises forming a single opening in a central portion of the stack of alternating conductive materials and dielectric materials to form two opposing fin structures and a contact region at a longitudinal end of the stack; and
forming the at least one staircase structure comprises forming a single staircase structure proximal to the contact region on a side of the at least one gate structure opposite the horizontal capacitor structures.

15. The method of claim 10, further comprising forming support structures extending in a second horizontal direction transverse to the first horizontal direction, wherein forming the support structures comprises:
forming openings extending vertically through the stack to the base material using an anisotropic material removal process;
removing portions of the dielectric materials between vertically adjacent portions of the conductive materials in an isotropic material removal process; and
forming other dielectric materials between the vertically adjacent portions of the conductive materials.

16. A memory device, comprising:
at least one memory array of memory cells comprising:
data lines extending in a horizontal direction;
access lines extending in a vertical direction, substantially transverse to the horizontal direction;
capacitor structures aligned horizontally in the horizontal direction and stacked vertically in the vertical direction; and
access devices electrically coupled to the access lines, the access devices comprising a conductive material common to the capacitor structures.

17. The memory device of claim 16, wherein the capacitor structures comprise between 10 and 100 individual capacitor containers in direct vertical alignment with one another, the individual capacitor containers of a single vertical level sharing a common access line.

18. The memory device of claim 16, further comprising junctionless nanowires comprising elongated portions of the conductive material extending in the horizontal direction, the junctionless nanowires configured as electrodes of the individual capacitor structures.

19. The memory device of claim 16, further comprising:
fin structures comprising individual levels of the conductive material of the capacitor structures; and
gate structures aligned with one another in the vertical direction, a single gate structure located on individual levels of a respective fin structure with the single gate structure connecting the capacitor structures of the respective fin structure.

20. The memory device of claim 19, further comprising conductive contacts and a CMOS under array (CUA) region under the at least one memory array, wherein the conductive contacts connect the gate structures to circuitry of the CUA region.

21. An electronic system, comprising:
- at least one input device;
- at least one output device;
- at least one processor device operably coupled to the at least one input device and the at least one output device; and
- a memory device operably coupled to the at least one processor device, the memory device comprising:
  - capacitor structures each comprising a first electrode and a second electrode separated from one another by a dielectric material, wherein the first electrode includes elongated portions of a conductive material extending in a horizontal direction, opposing portions of the first electrode connected with one another by a contact portion extending therebetween;
  - gate structures located proximate the contact portion with a single gate structure coupled to each of the opposing portions of the first electrode; and
  - conductive lines extending in a vertical direction transverse to the horizontal direction, the conductive lines connecting individual gate structures of respective capacitor structures stacked in the vertical direction.

* * * * *

UNITED STATES PATENT AND TRADEMARK OFFICE
CERTIFICATE OF CORRECTION

PATENT NO. : 11,094,699 B1
APPLICATION NO. : 16/886497
DATED : August 17, 2021
INVENTOR(S) : William M. Brewer, Christopher Locke and Kyle B. Campbell Page 1 of 1

It is certified that error appears in the above-identified patent and that said Letters Patent is hereby corrected as shown below:

In the Specification
Column 9, Line 46, change "Li" to --$L_1$--
Column 9, Line 50, change "Hi" to --$H_1$--

Signed and Sealed this
Twenty-first Day of September, 2021

Drew Hirshfeld
*Performing the Functions and Duties of the
Under Secretary of Commerce for Intellectual Property and
Director of the United States Patent and Trademark Office*